US010288263B2

(12) United States Patent
Nishikawa et al.

(10) Patent No.: US 10,288,263 B2
(45) Date of Patent: May 14, 2019

(54) PLANAR LIGHT-EMITTING PANEL AND ELASTIC JACKET

(71) Applicant: KANEKA CORPORATION, Osaka-shi, Osaka (JP)

(72) Inventors: Akira Nishikawa, Kamikita-gun (JP); Yukinobu Hamada, Yokohama (JP); Hidemaro Saiki, Misawa (JP); Tsukasa Sumiyoshi, Shimokita-gun (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 165 days.

(21) Appl. No.: 15/500,215

(22) PCT Filed: Jul. 27, 2015

(86) PCT No.: PCT/JP2015/071280
§ 371 (c)(1),
(2) Date: Jan. 30, 2017

(87) PCT Pub. No.: WO2016/021438
PCT Pub. Date: Feb. 11, 2016

(65) Prior Publication Data
US 2017/0276317 A1    Sep. 28, 2017

(30) Foreign Application Priority Data

Aug. 8, 2014   (JP) ................................ 2014-162890

(51) Int. Cl.
*F21V 15/01*    (2006.01)
*F21V 21/14*    (2006.01)
(Continued)

(52) U.S. Cl.
CPC .............. *F21V 15/01* (2013.01); *F21V 21/14* (2013.01); *F21V 23/06* (2013.01); *H01L 51/524* (2013.01);
(Continued)

(58) Field of Classification Search
CPC ............. F21Y 2115/20; F21Y 2105/00; H01L 51/524; H01L 2251/5361; B32B 17/10541; F21V 15/01
See application file for complete search history.

(56) References Cited

U.S. PATENT DOCUMENTS 8,439,191 B1    5/2013   Lu
9,112,181 B2 *  8/2015   Yamae .................. H05B 33/04
(Continued)

FOREIGN PATENT DOCUMENTS

JP    2003295788 A    10/2003
JP    2006331856 A    12/2006
(Continued)

OTHER PUBLICATIONS

ISA Japan Patent Office, International Search Report Issued in Application No. PCT/JP2015/071280, dated Oct. 20, 2015, WIPO, 4 pages.
(Continued)

*Primary Examiner* — Erin Kryukova
(74) *Attorney, Agent, or Firm* — Alleman Hall Creasman & Tuttle LLP

(57) ABSTRACT

The present invention has an object to provide a planar light-emitting panel attached with a jacket to protect edges of a light-emitting tile, while the jacket is prevented from being peeled off or removed from the light-emitting tile. The planar light-emitting panel includes the light-emitting using a glass substrate as a base, and an elastic jacket covering end faces of the glass substrate. An emission surface is provided on a front face of the light-emitting tile. The elastic jacket has a rear face side opening, on a rear face side of the light-emitting tile. On opening edges of the rear face side opening, when viewed from rear, a plurality of jacket side protrusions protruding toward a center side of the rear face side opening are formed. The jacket side protrusions are
(Continued)

separated at predetermined intervals along the opening edges.

14 Claims, 17 Drawing Sheets

(51) Int. Cl.
 *F21V 23/06* (2006.01)
 *H01L 51/52* (2006.01)
 *F21Y 105/00* (2016.01)
 *F21Y 105/10* (2016.01)
 *F21Y 115/20* (2016.01)

(52) U.S. Cl.
 CPC ...... *H01L 51/5253* (2013.01); *H01L 51/5268* (2013.01); *F21Y 2105/00* (2013.01); *F21Y 2105/10* (2016.08); *F21Y 2115/20* (2016.08); *H01L 2251/5361* (2013.01)

(56) References Cited

U.S. PATENT DOCUMENTS

| | | |
|---|---|---|
| 2002/0125815 A1 | 9/2002 | Wakita |
| 2009/0302760 A1* | 12/2009 | Tchakarov .......... H01L 51/5203 313/512 |
| 2010/0033975 A1 | 2/2010 | Beck et al. |
| 2010/0177031 A1 | 7/2010 | Fan et al. |
| 2011/0157893 A1* | 6/2011 | Ngai .......... F21S 2/00 362/249.02 |
| 2011/0205758 A1* | 8/2011 | Kim .......... F21S 8/04 362/609 |
| 2011/0228458 A1* | 9/2011 | Richardson .......... H04M 1/0252 361/679.01 |
| 2012/0025701 A1 | 2/2012 | Bertram |
| 2012/0091923 A1* | 4/2012 | Kastner-Jung .......... B60Q 3/745 315/360 |
| 2012/0294016 A1* | 11/2012 | Tran .......... F21S 2/005 362/382 |
| 2013/0093308 A1* | 4/2013 | Kagotani .......... B32B 17/10036 313/45 |
| 2013/0306952 A1* | 11/2013 | Yamae .......... H01L 51/5212 257/40 |
| 2014/0211462 A1* | 7/2014 | Keller .......... F21S 2/00 362/231 |
| 2014/0225099 A1* | 8/2014 | Yamae .......... H01L 51/524 257/40 |
| 2014/0247584 A1 | 9/2014 | Kodama et al. |
| 2014/0247600 A1* | 9/2014 | Tanahashi .......... F21V 7/00 362/307 |

FOREIGN PATENT DOCUMENTS

| | | |
|---|---|---|
| JP | 2007005227 A | 1/2007 |
| JP | 2009048942 A | 3/2009 |
| JP | 2009158103 A | 7/2009 |
| JP | 2011029041 A | 2/2011 |
| JP | 2012004056 A | 1/2012 |
| JP | 2012523661 A | 10/2012 |
| WO | 2010116300 A1 | 10/2010 |
| WO | 2013080836 A1 | 6/2013 |

OTHER PUBLICATIONS

International Bureau of WIPO, International Preliminary Report on Patentability Issued in Application No. PCT/JP2015/071280, dated Feb. 14, 2017, WIPO, 5 pages.
European Search Report, Supplementary European Search Report Issued in European Application No. 15830333, dated Nov. 14, 2017, The Hague, Netherlands, 2 pages.

* cited by examiner

FIG.4
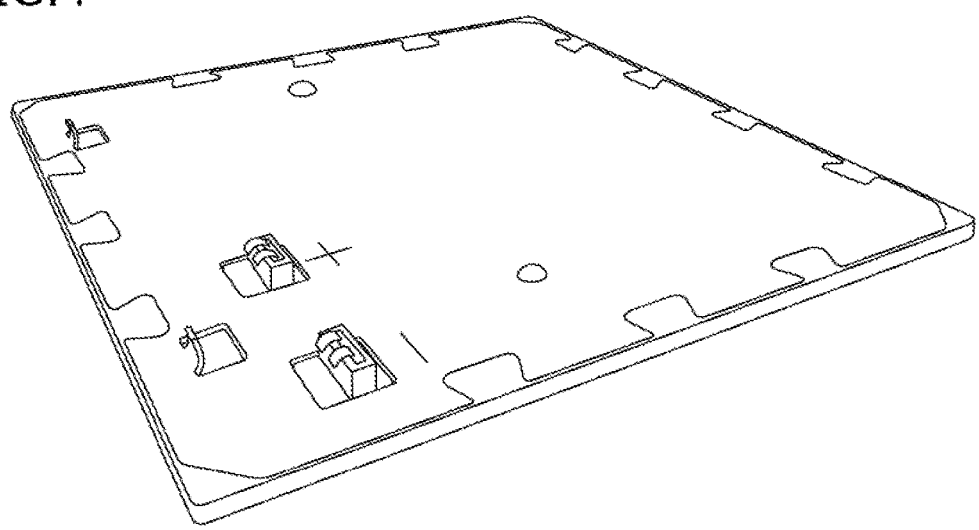
FIG.5
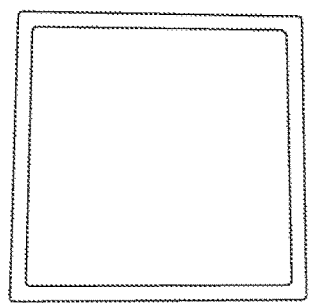 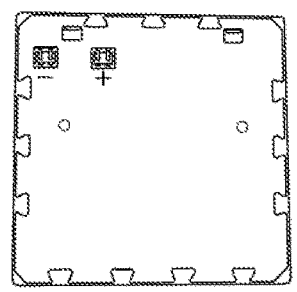

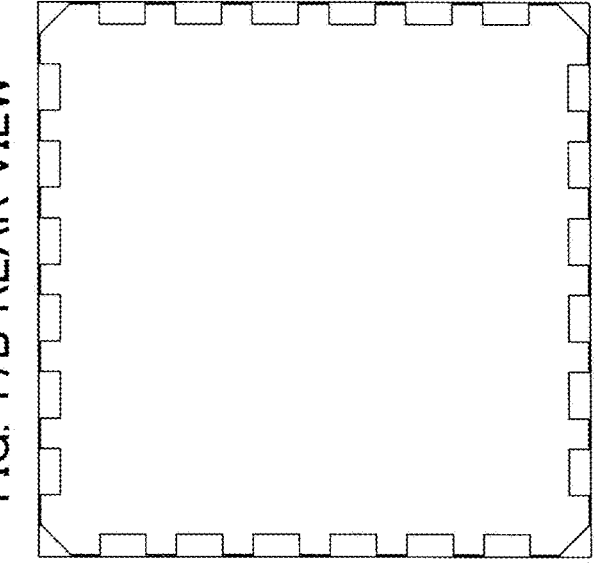
FIG. 17B REAR VIEW
FIG. 17E RIGHT-SIDE VIEW
FIG. 17C PLAN VIEW
FIG. 17A FRONT VIEW
FIG. 17D BOTTOM VIEW
FIG. 17F LEFT-SIDE VIEW

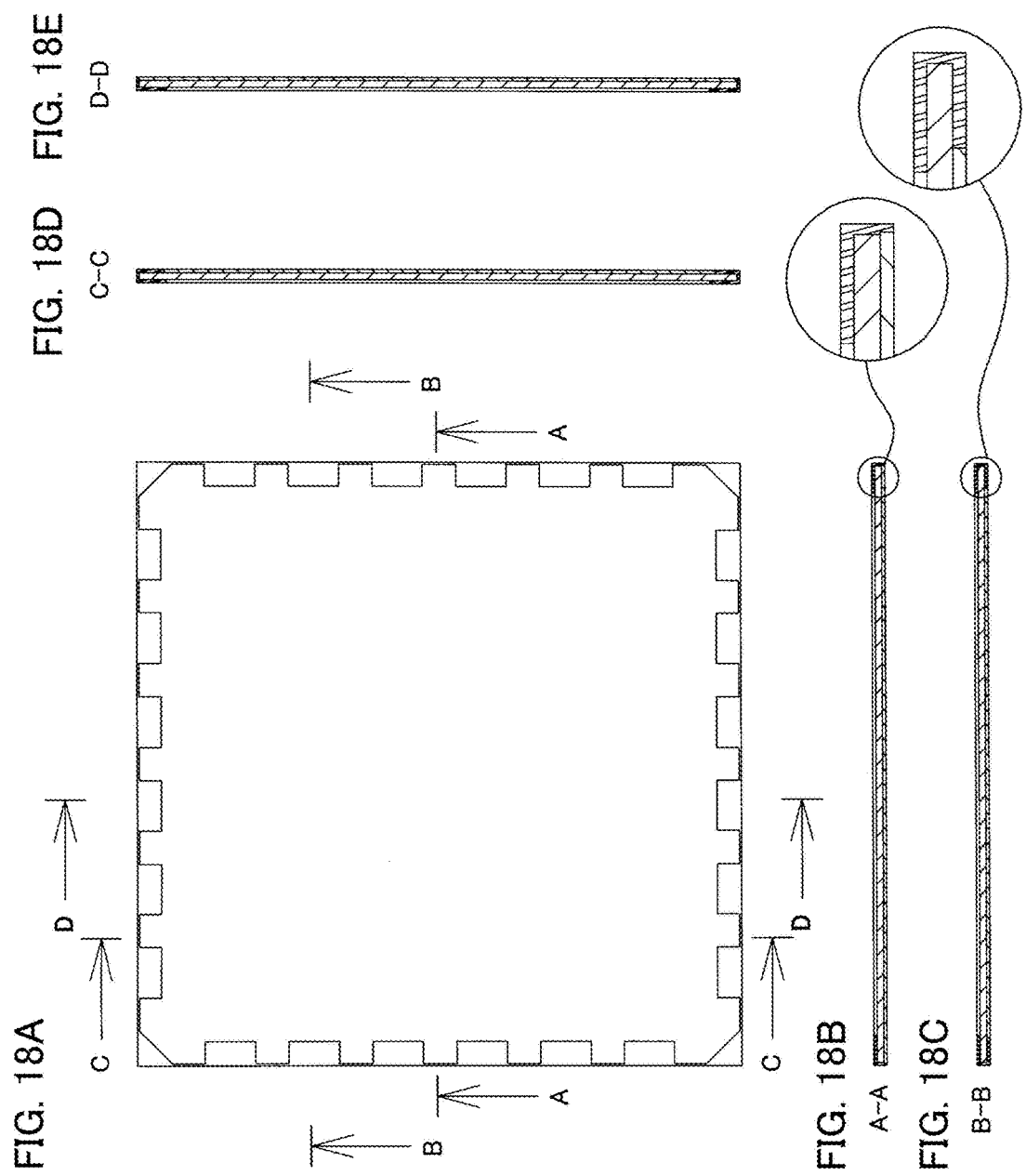

PLANAR LIGHT-EMITTING PANEL AND ELASTIC JACKET

TECHNICAL FIELD

The present invention relates to a planar light-emitting panel. The present invention in particular relates to a planar light-emitting panel including a casing for protecting side faces of a thin, planar light-emitting tile.

BACKGROUND ART

As alternatives to conventional lighting apparatuses such as incandescent lamps and fluorescent lamps, planar light-emitting panels such as organic EL light-emitting panels have been focused on in recent years and investigated by many researchers.

This planar light-emitting panel incorporates a thin, planar light-emitting tile. Examples of the planar light-emitting panel include an organic EL light-emitting panel where an organic EL tile is surrounded by a jacket (frame).

This organic EL tile forms an organic EL element including opposing thin film electrodes, either or both of which has(have) a translucent property, and a thin film organic light-emitting layer laminated between the electrodes, on a base glass substrate or a substrate such as a translucent resin film/a metallic sheet. The formed organic EL element is then sealed with a predetermined sealing method.

When electric power is supplied between the opposing electrodes between which the thin film organic light-emitting layer is interposed, electrons and holes recombine in the thin film organic light-emitting layer, thus the planar organic EL tile emits light due to this recombination. So to speak, this organic EL tile can be referred to as a planar light-emitting tile. That is, the organic EL tile is a superior, thinner, lighter, planar light-emitting device.

To use a planar light-emitting tile as a lighting apparatus, a substrate of the planar light-emitting tile must be free from cracking and chipping. To use a planar light-emitting tile as a lighting apparatus, edges of the planar light-emitting tile must be treated so as to prevent injuries such as a scratch on a finger. Therefore, in order to use a planar light-emitting tile as a lighting apparatus, a casing such as a jacket satisfying the above described requirements is required, in addition to a structure for protecting side faces of a substrate. When using a planar light-emitting tile as a lighting apparatus, a casing should be improved to utilize the advantages of a thinner, lighter, and planar light-emitting tile as much as possible.

Patent Documents 1 to 4, for example, disclose casing structures of conventional planar light-emitting tiles.

PRIOR ART DOCUMENTS

Patent Documents

Patent Document 1: JP 2006-331856 A
Patent Document 2: JP 2007-5227 A
Patent Document 3: JP 2009-158103 A
Patent Document 4: JP 2012-523661 T

DISCLOSURE OF INVENTION

Technical Problem

Frames and frame pieces used in the casing structures described in Patent Documents 1 to 3, however, lead to higher cost for necessary fine machining. Patent Documents 1 to 3 also require a skilled operator for precise assembly.

That is, since, in a lighting apparatus described in Patent Document 1, two separated pieces surround a planar light-emitting source to form a frame body, the separated pieces need to structurally be machined precisely in size for precise assembly.

Since, in lighting apparatuses described in Patent Documents 2 and 3, frame bodies are used as electric contacts, the frame bodies need to structurally be finely machined, as well as precisely be assembled for connections between terminals on panel bodies and the electric contacts.

Patent Document 4 discloses an OLED device in which an OLED panel is attached with a soft frame. The OLED device according to Patent Document 4 is deemed to offer robust, aesthetic appearance.

When the inventors of the present invention have prototyped, using a soft frame, an organic EL light-emitting panel offering aesthetic appearance, by following Patent Document 4, the inventors have found that the soft frame is removed or peeled off due to a glass substrate that has expanded and contracted before and after the light-emitting panel emits light.

In view of the above described problems in conventional arts, the present invention has an object to provide a planar light-emitting panel attached with a jacket to protect edges of a light-emitting tile, while the jacket is prevented from being peeled off or removed from the light-emitting tile.

Solution to Problem

With an aspect of the present invention, a planar light-emitting panel includes: a light-emitting tile built on a glass substrate, the light emitting tile having an emission surface on a front face thereof; and an elastic jacket covering edge end faces of the glass substrate, the elastic jacket having a rear face side cover that covers a rear face of the light-emitting tile, the rear face side cover being formed in a ring shape to form a rear face side opening and having a plurality of jacket side protrusions that protrude toward a center side thereof in a rear face view, wherein the plurality of jacket side protrusions form part of the rear face side opening and are arranged in parallel at predetermined intervals in a circumferential direction of the rear face side opening, and wherein two of the adjacent jacket side protrusions form a jacket side recess that recesses from a center side of the rear face side opening.

According to this aspect, end faces of a glass substrate on which a light-emitting tile is built can be protected with an elastic jacket. That is, the elastic jacket is an edge protection member protecting edges of the light-emitting tile.

According to this aspect, due to its elasticity, the elastic jacket can easily be attached to the light-emitting tile.

According to this aspect, a rear face side cover covering a rear face of the light-emitting tile has a ring-shaped rear face side opening, thus the rear face side cover can be formed in a cost effective manner with less amount of material used, when compared with a case where a rear face of a light-emitting tile is wholly covered.

According to this aspect, part of the rear face side opening on the elastic jacket is configured by jacket side protrusions separately arranged in a circumferential direction of the rear face side opening to form jacket side recesses. Even if a thinner, easily deflectable glass substrate, i.e. a base member of a light-emitting tile, deflects, for example, the jacket side protrusions and the jacket side recesses configuring the rear face side opening allow the elastic jacket to easily follow this deflection to deform.

Even if heat generated when the light-emitting panel emits light has caused the light-emitting panel itself to repeatedly expand and contract, the jacket side protrusions and the jacket side recesses also allow the elastic jacket to follow the expansion and contraction and to deform in a direction along with an opening edge. In a specific example, when the light-emitting tile expands, and then contracts, the elastic jacket having elasticity follows the expansion and contraction to expands, and then contracts. A compressive force applied near the rear face side opening in a circumferential direction along with this contraction of the elastic jacket can be detoured by the formed jacket side recesses to prevent the elastic jacket from being expanded in a thickness direction.

As described above, according to this aspect, an elastic jacket is prevented from being removed from a light-emitting tile, from being peeled off near a center portion of an end side of a glass substrate, and from being expanded, thus a reliable planar light-emitting panel can be provided. The simply and cost effectively provided planar light-emitting panel offers a thinner, lighter feature with long-term reliability where its edges can resist impacts, but rarely cause injury to human.

In a preferable aspect, the light-emitting tile is a polygon having a first side, and the rear face side cover is provided with at least three of the jacket side recesses in parallel along the first side of the light-emitting tile.

According to this aspect, the at least three jacket side recesses arranged in parallel on a side can absorb the deflected light-emitting tile to prevent the elastic jacket from being removed or peeled off.

In a preferable aspect, the light-emitting tile has a second side opposite to the first side of the light-emitting tile, and the rear face side cover is also provided with at least three of the jacket side recesses along the second side of the light-emitting tile.

According to this aspect, the at least three jacket side recesses provided on the opposite side further absorb a deflection to further prevent the elastic jacket from being removed or peeled off.

In a preferable aspect, the light-emitting tile is a polygon, and the rear face side cover is provided with the jacket side recesses on each side of the light-emitting tile.

According to this aspect, the jacket side recesses provided on each side prevent the elastic jacket from being removed from the light-emitting tile even if a compressive force is applied on either of the sides due to expansion and contraction.

The above described aspect may be a planar light-emitting panel including a glass substrate having a maximum thickness of 2 mm and a rubber jacket covering a whole circumference of the glass substrate so as to have a planar light-emitting region. The jacket has: a main face having a light-emitting region opening including the planar light-emitting region and having a form similar to an external form of the planar light-emitting region, and having a casing A surrounding the light-emitting region opening; another main face having a rear face opening including a plurality of recesses, and having a casing B provided with protrusions arranged around the rear face opening to correspond to the plurality of recesses; and a planar side face that continuously joins the main face and the other main face at the whole circumference, and that are perpendicular to both the main faces.

According to this aspect, in such a panel that is reliable, because, even if the panel is thinner in thickness, the panel does not come off, peel off, or expand at a center portion of a side. Further, the jacket can easily be wrapped for easy panel assembly. With its less amount of material used, such a jacket can be a cost-effective edge protection member.

In a preferable aspect, the elastic jacket includes a front face side cover covering the front face of the light-emitting tile, the front face side cover being formed in a ring shape so as to surround the emission surface, the front face side cover having an average width wider than an average width of the rear face side cover excluding the jacket side protrusions thereof.

According to this aspect, a wider average width of the front face side cover than the average width of the portion excluding the jacket side protrusions of the rear face side cover effectively prevents the elastic jacket from being removed, peeled off, or expanded.

In this aspect, an average width of the front face side cover may be wider than an average width of the rear face side cover.

According to this aspect, an average width of the casing A served as the front face side cover is wider than an average width of the casing B served as the rear face side cover. As described above, the wider average width of casing A than that of casing B can effectively prevent the elastic jacket from being removed, peeled off, or expanded. A highly aesthetic panel can also be provided.

According to this aspect, a wider average width of the front face side cover than an average width of the rear face side cover further allows an operator to easily attach the light-emitting panel from the rear face.

In a further preferable aspect, the elastic jacket includes a side cover covering side end faces of the light-emitting tile, the side cover joining the front face side cover and the rear face side cover continuously or intermittently around a whole circumference of the light-emitting tile.

According to this aspect, the side cover integrally joining the front face side cover and the rear face side cover on a whole circumference of the light-emitting panel can securely hold the light-emitting panel because the front face side cover and the rear face side cover each other come close or apart when the light-emitting panel emits light, for example, and deflects in a thickness direction. The elastic jacket is as a result prevented from being peeled off from the light-emitting tile.

As for the above described aspect, the side cover should preferably join the front face side cover and the rear face side cover continuously around the whole circumference of the light-emitting tile.

According to this aspect, the light-emitting panel can be prevented from water's or other liquid's infiltration in a surface direction, as well as the glass substrate can be prevented from chipping and cracking since the end faces of the glass substrate are not exposed.

In a preferable aspect, the light-emitting tile includes: an organic EL tile including an organic EL light-emitting element layer on a main face of the glass substrate; and an exterior layer covering a rear face of the organic EL tile to form an exterior of the light-emitting tile, the exterior layer being in contact with the jacket side protrusions in the rear face view.

The above described aspect may be a planar organic EL light-emitting panel including, on another one of the main faces of the glass substrate, an organic EL light-emitting element layer with a translucent first electrode layer, a light-emitting layer including at least an organic compound, and a second electrode layer laminated in this order, and an exterior layer in contact with the plurality of protrusions.

According to these aspects, among many planar light-emitting tiles, an organic EL tile that offers soft illumination is used to serve as a planar light-emitting tile. The planar light-emitting tile can therefore be used as a planar light source for providing soft illumination in a living space and other spaces.

According to these aspects, an exterior layer covering a rear face of an organic EL tile to form an exterior of a light-emitting tile improves mechanical strength of a planar light-emitting panel to achieve a reliable product for use in actual applications.

In a preferable aspect, the exterior layer includes: a main body expanding in plane in the rear face view; and exterior layer side protrusions protruding outward from an outer circumferential edge of the main body and engaging with the jacket side protrusions.

According to this aspect, exterior side protrusions engage with side faces of the jacket side protrusions. That is, the exterior side protrusions and the jacket side protrusions engage each other in directions along opening edges of the rear face side opening. The elastic jacket can therefore be prevented from being misaligned in a circumferential direction, thus can be prevented from being peeled off or expanded due to such misalignment.

In a preferable aspect, the exterior layer side protrusions fit into the jacket side recesses.

According to this aspect, the jacket side protrusions and the exterior layer side recesses fit into each other so that the elastic jacket securely fits into the exterior layer, thus the elastic jacket is less likely to misalign in the circumferential direction. The jacket is also less likely to come off from the planar light-emitting tile in a vertical direction relative to the emission surface.

In the above described aspect, the light-emitting tile may be rectangular. The rear face side cover may include, when viewed from rear, two longitudinal side covers opposing each other in a horizontal direction. The two longitudinal side covers may respectively include jacket side protrusions protruding toward a center side of the rear face side opening. The jacket side protrusions formed on the two longitudinal side covers may be arranged in identical straight lines in the horizontal direction.

In the above described aspect, the jacket side protrusions on one of the longitudinal side covers may be identical in number to the jacket side protrusion on the other longitudinal side cover.

In the above described aspect, the light-emitting tile may be rectangular. The rear face side cover may include, when viewed from rear, two lateral side covers opposing each other in a vertical direction. The two lateral side covers may be formed with jacket side protrusions protruding toward the center side of the rear face side opening. The jacket side protrusions on one of the lateral side covers may be shifted in the horizontal direction relative to the jacket side protrusion on the other lateral side cover.

In the above described aspect, the jacket side protrusions on the one of the lateral side covers may be fewer in number than the jacket side protrusions on the other lateral side cover.

In a preferable aspect, the light-emitting tile includes: an organic EL tile including an organic EL light-emitting element layer on a main face of the glass substrate; and an exterior layer covering a rear face of the organic EL tile to form an exterior of the light-emitting tile, and an inorganic sealing layer and an adhesive layer are interposed between the glass substrate and the exterior layer, the inorganic sealing layer covering part of the organic EL light-emitting element layer, the adhesive layer expanding in plane and partially or wholly covering the inorganic sealing layer, the inorganic sealing layer having a minimum average thickness of 1 µm but being thinner than a thickness of the adhesive layer.

In the above described aspect, between the organic EL light-emitting element layer and the exterior layer, an inorganic sealing layer being in contact with the organic EL light-emitting element layer and having a minimum average thickness of 1 µm, and an adhesive layer may be included. An average thickness of the adhesive layer may be thicker than the average thickness of the inorganic sealing layer.

According to these aspects, both the inorganic sealing layer that has a minimum average thickness of 1 µm and that seals the organic EL light-emitting element layer, and the adhesive layer formed thicker than the inorganic sealing layer further improve a sealing effect, an effect for preventing as much as possible the light-emitting panel from not emitting light, and a stress reduction effect.

The term "sealing effect" referred to herein is an effect for, while utilizing in maximum a feature of the thinner, planar light-emitting tile by sealing the planar light-emitting tile with a solid film, i.e. inorganic sealing layer, preventing as much as possible moisture from being entered into the organic EL light-emitting element layer to reduce dark spots.

The term "effect for preventing as much as possible a light-emitting panel from not emitting light" referred to herein means the following. That is, even though a portion having a large leak current is generated, the portion can stay as an open-mode non light-emitting point with a balanced relationship between a compressive stress and a tensile stress in the inorganic sealing layer. Therefore, since the portion does not become a short-mode non light-emitting point, the defect of not emitting light can be prevented although short circuit occurs and some voltage is applied there.

The term "stress reduction effect" referred herein is an effect for allowing, through complex functionality of the inorganic sealing layer and the adhesive layer, an adhesive configuring an adhesive layer to easily flow into a target location with its higher wettability so as to achieve a highly reliable panel by stably maintaining this open mode even if an external force is applied to an element.

In this aspect, the inorganic sealing layer may preferably be formed of a silicon alloy.

According to this aspect, a more significant effect for preventing as much as possible a light-emitting panel from not emitting light can be presented.

A sealing structure by means of a sealing plate such as sealing glass cap is sometimes used for an organic EL tile. Due to its heavy, bulky sealing plate, this sealing structure might however sometimes sacrifice features of a thinner, lighter organic EL tile.

In a preferable aspect, the light-emitting tile may therefore not include a sealing plate having a minimum thickness of 0.5 mm between the exterior layer and the glass substrate.

According to this aspect, because a sealing plate having a minimum thickness of 0.5 mm is not included, the features of the thinner, lighter organic EL tile can be fully utilized.

In the above described aspect, the inorganic sealing layer, the adhesive layer, and the exterior layer are laminated in this order from the glass substrate. More preferably, the inorganic sealing layer and the adhesive layer should directly be in contact with.

According to this aspect, disposing only members having low rigidity, such as a thin film for an inorganic sealing layer and resin films for an adhesive layer and an exterior layer, on a non-emission surface of a light-emitting element can eliminate a heavier, thicker sealing plate.

In a preferable aspect, the light-emitting tile is a white light-emitting tile having a white emission surface, and the elastic jacket includes a white pigment to be substantially white in color.

The term "substantially white" referred to herein is a neutral color having a certain brightness.

According to this aspect, the emission surface and the jacket, which are substantially identical in color, can wholly be shown bright when the light-emitting tile emits light, thus a planar light-emitting panel having superior aesthetic appearance can be provided.

In a preferable aspect, the light-emitting tile includes a light scattering resin layer laminated on the emission surface.

According to this aspect, since the resin layer scatters light emitted from an emission surface, a planar light-emitting panel having a superior optical characteristic, compared with a conventional planar light-emitting panel, can be provided.

In a preferable aspect, the emission surface emits light when a planar light-emitting region emits light, and the planar light-emitting region includes a plurality of sub-light-emitting regions separated each other.

This aspect can preferably be utilized even in planar light-emitting panels including a plurality of sub-light-emitting regions, such as integrated organic EL panels and matrix organic EL panels.

An aspect of the present invention is an elastic jacket covering edge end faces of a light-emitting tile having an emission surface on a front face thereof, the elastic jacket including a rear face side cover that covers a rear face of the light-emitting tile, that is formed in a ring shape to form a rear face side opening, and that has a plurality of jacket side protrusions protruding toward a center side of the rear face side opening, the jacket side protrusions forming part of the rear face side opening and being arranged in parallel at predetermined intervals in a circumferential direction of the rear face side opening, wherein two of the adjacent jacket side protrusions form a jacket side recess that recesses from the center side of the rear face side opening.

According to this aspect, the simply and cost effectively provided elastic jacket offers a thinner, lighter feature with long-term reliability where its edges can resist impacts, but rarely cause injury to human.

Effect of Invention

According to the present invention, a thinner, lighter, planar light-emitting panel having an edge protection function, which is appropriate for actual production, can be achieved.

BRIEF DESCRIPTION OF DRAWINGS

FIG. 4 is a photo of a main face of a non-emission surface of a planar light-emitting panel according to another embodiment of the present invention.

FIG. 5 is photos of a main face, i.e. an emission surface (right), and another main face, i.e. a non-emission surface (left), of a planar light-emitting panel according to still another embodiment of the present invention.

FIGS. 7A and 7B are cross-sectional views schematically illustrating planar light-emitting tiles according to the present invention, wherein FIG. 7A is a cross-sectional view when sealing glass is used for sealing, and FIG. 7B is a cross-sectional view when a sealing layer is used for sealing.

FIGS. 17A to 17F are views illustrating a lighting apparatus designed in accordance with this application, wherein FIG. 7A is a front view, FIG. 7B is a rear view, FIG. 7C is a plan view, FIG. 7D is a bottom view, FIG. 7E is a right-side view, and FIG. 7F is a left-side view.

FIGS. 18A to 18E are views illustrating another lighting apparatus designed in accordance with this application, wherein FIG. 8A is a rear view, FIG. 8B is an A-A cross-sectional view of FIG. 8A, FIG. 8C is a B-B cross-sectional view of FIG. 8A, FIG. 8D is a C-C cross-sectional view of FIG. 8A, and FIG. 8E is a D-D cross-sectional view of FIG. 8A.

BEST MODE FOR CARRYING OUT THE INVENTION

A summary and embodiments of the present invention will now be described herein. Unless otherwise specified, an emission surface 10 is referred to as a front face, while an exterior layer 4 is referred to as a rear face.

In whole descriptions, in principle, first the present invention will conceptually be described, then the embodiments will be described in line with implementations.

(Planar Light-Emitting Panel 1)

A planar light-emitting panel 1 according to the present invention will now conceptually be described herein.

Figure 1:
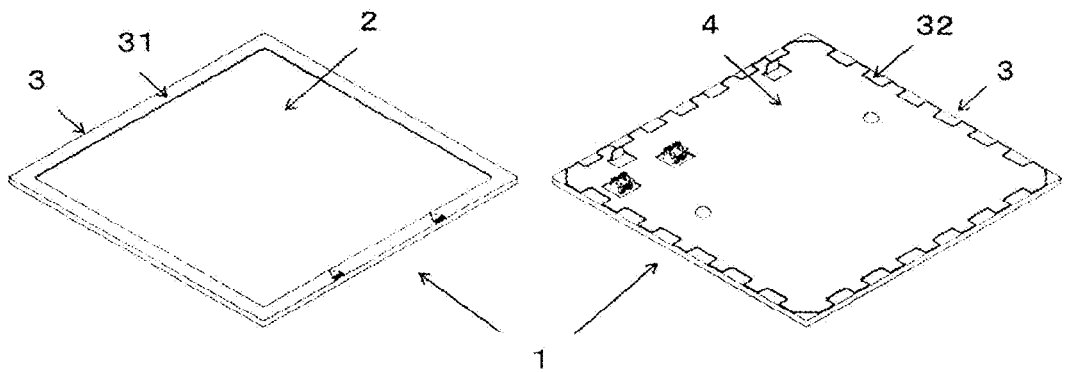
FIG. 1 is a perspective view illustrating a planar light-emitting panel according to an embodiment of the present invention.
Figure 2:
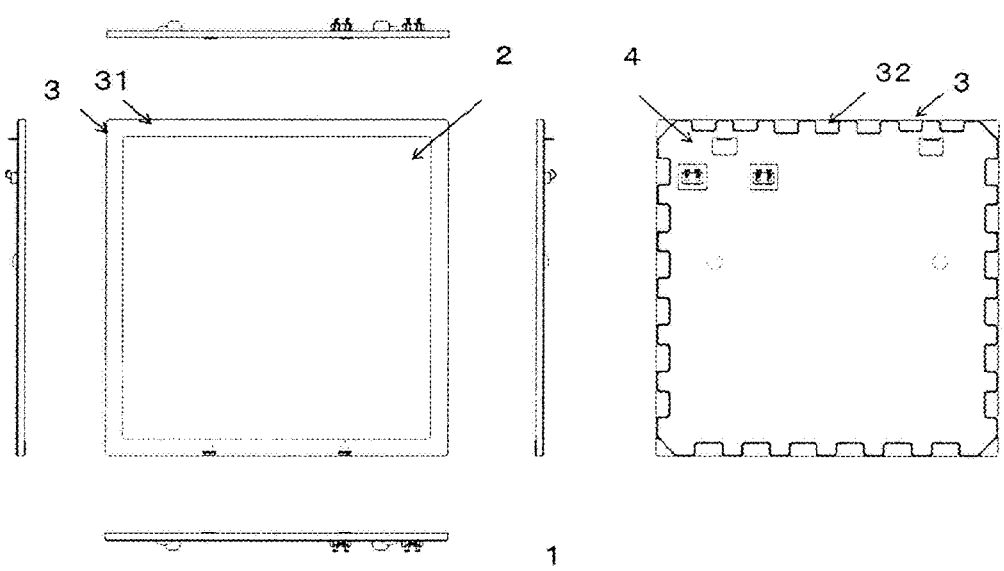
FIG. 2 is a six-direction view of the planar light-emitting panel shown in FIG. 1.

FIG. 1 is a perspective view illustrating a planar light-emitting panel 1 according to an embodiment of the present invention. FIG. 2 is a six-direction view of the planar light-emitting panel 1 shown in FIG. 1.

The planar light-emitting panel 1 according to the present invention includes, as shown in FIGS. 1 and 2, a planar light-emitting tile 2, and an elastic jacket 3 made of rubber.

Figure 6:
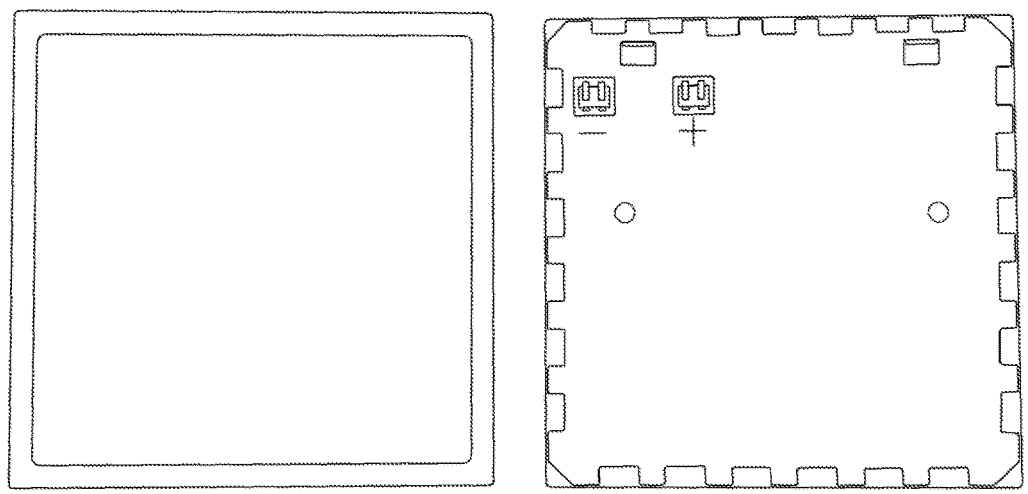
FIG. 6 is a photo of a main face, i.e. an emission surface (right), and another main face, i.e. of a non-emission surface (left) of a planar light-emitting panel according to still another embodiment of the present invention.
Figure 13:
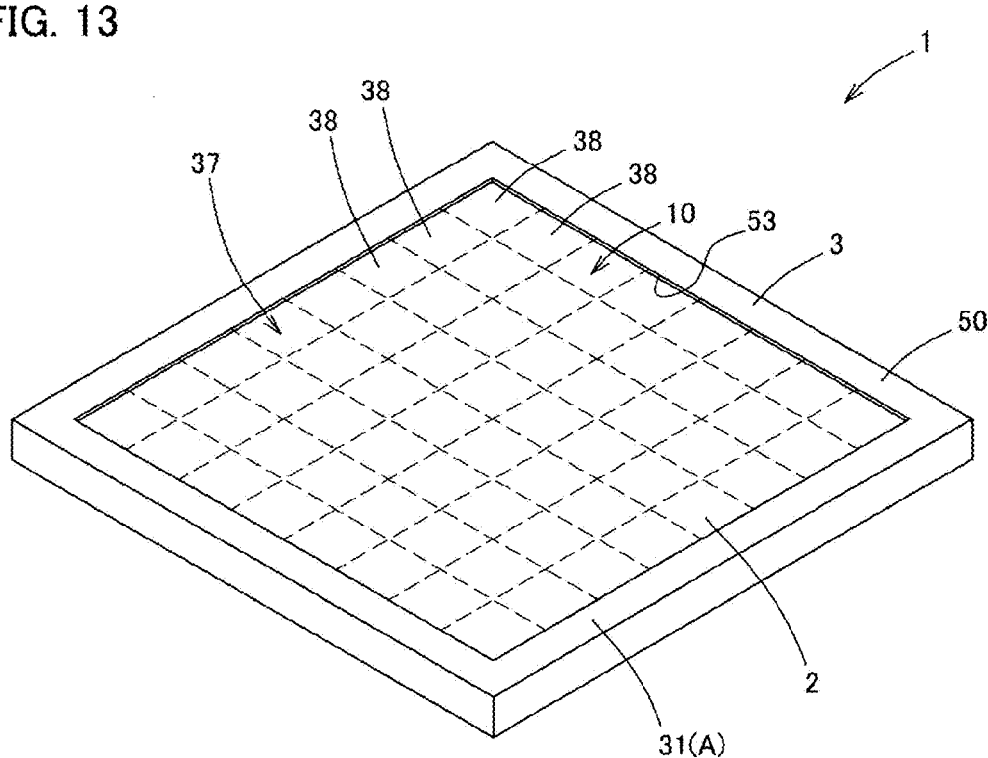
FIG. 13 is a perspective view of the planar light-emitting panel shown in FIG. 9 when viewed from an emission surface.

The planar light-emitting tile 2 according to the present invention includes, as shown in FIG. 13, a planar light-emitting region 37 on its emission surface 10, i.e. a main face. The planar light-emitting tile 2 is a member built on, as a main component, a glass substrate 20 having a maximum thickness of 2 mm. In the planar light-emitting panel 1 according to the present invention, as shown in FIGS. 1 and 6, its whole circumference is covered with the elastic jacket 3 according to the present invention.

As shown in FIG. 1, the exterior layer 4 should preferably be disposed on a non-emission surface side (a surface opposite to the emission surface 10) of the planar light-emitting tile 2 according to the present invention. To incorporate an organic EL tile 6, for example, the exterior layer 4 should preferably be applied on a sealing layer 28 sealing an organic EL light-emitting element 22.

Next, the planar light-emitting panel 1 according to the first embodiment of the present invention will now be described herein. Components similar or identical to the above described components are described briefly with identical symbols applied.

The planar light-emitting panel 1 according to the first embodiment is a light-emitting device mainly used as a lighting apparatus. As can be seen from FIGS. 9 and 10, the planar light-emitting panel 1 is configured by the planar light-emitting tile 2 and the elastic jacket 3. As shown in FIG. 13, the planar light-emitting tile 2 includes, on its front face, the emission surface 10 that actually emits light.

The planar light-emitting tile 2 includes, as a main component, the thin-plated glass substrate 20 having a maximum average thickness of 2 mm. The planar light-emitting tile 2 therefore easily deflects by an external force or other forces, i.e. could easily be damaged at its corner or edge.

In the planar light-emitting panel 1 according to the first embodiment, a whole circumference of the planar light-emitting tile 2 is covered with the special elastic jacket 3 in order to prevent the planar light-emitting tile 2 from being damaged due to an external force or other forces. The elastic jacket 3 having a special shape that has not yet been adopted in conventional light-emitting panels is a feature of the planar light-emitting panel 1 according to the first embodiment.

Figure 9:
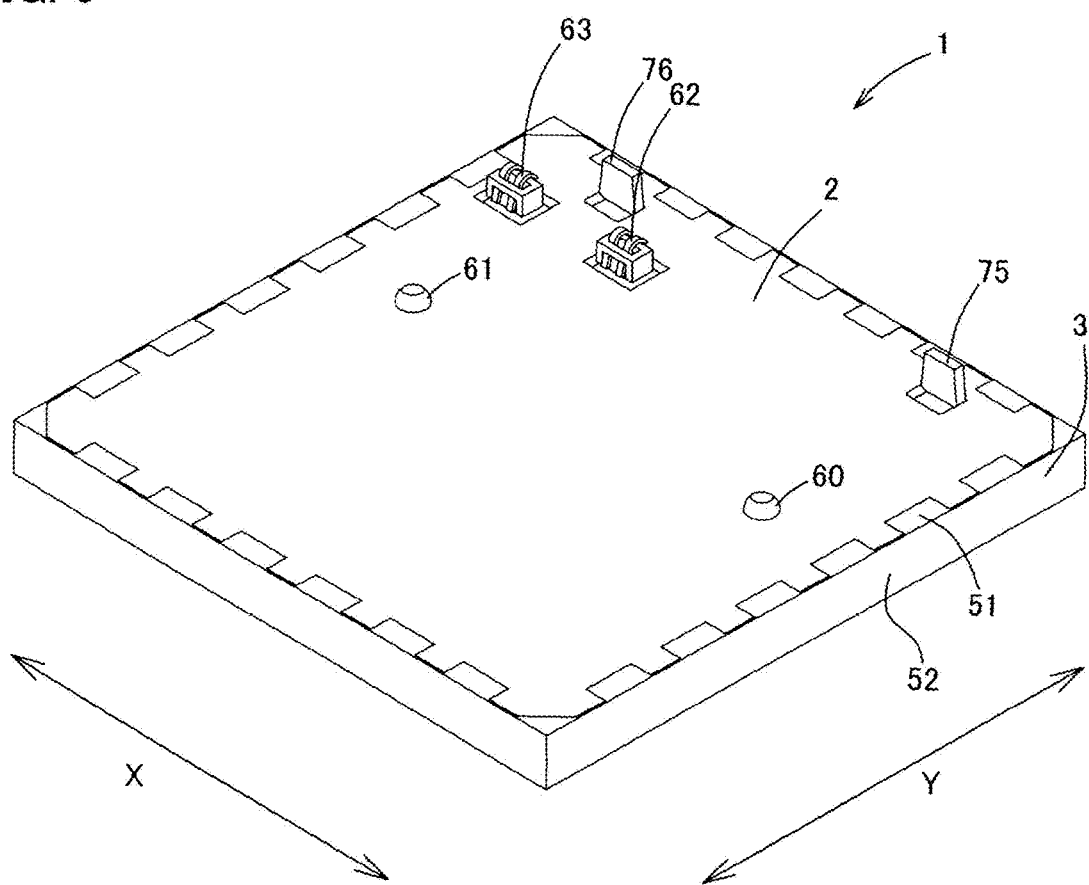
FIG. 9 is a perspective view schematically illustrating a planar light-emitting panel according to a first embodiment of the present invention.
Figure 10:
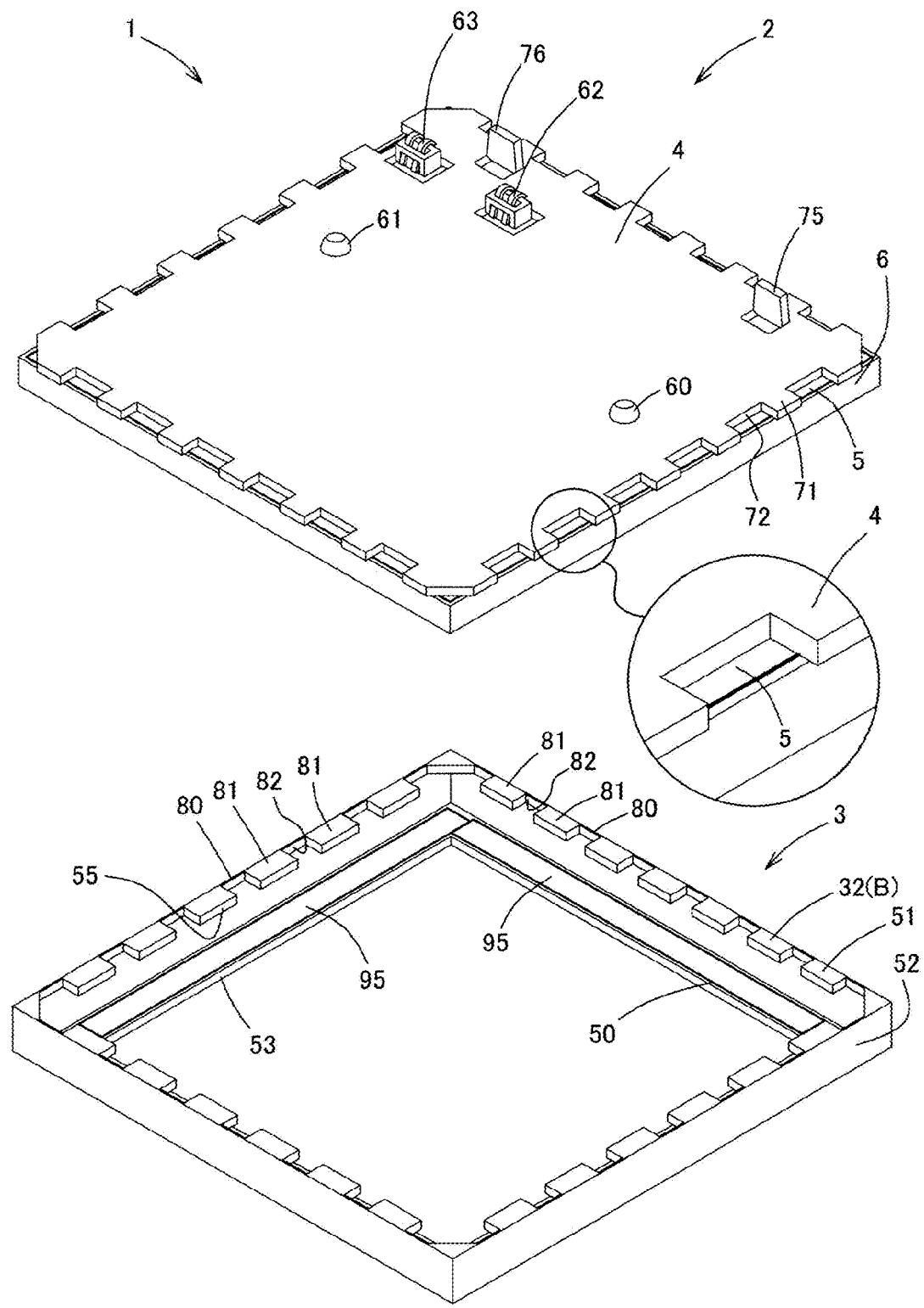
FIG. 10 is an exploded perspective view of the planar light-emitting panel shown in FIG. 9, where the planar light-emitting tile is removed from a jacket.

The planar light-emitting panel 1 according to the first embodiment includes, as main components, as shown in FIGS. 9 and 10, the planar light-emitting tile 2, the elastic jacket 3, and an adhesive member 5, as well as includes, when required, double sided tapes 95.

(Planar Light-Emitting Tile 2)

The planar light-emitting tile 2 according to the present invention will now conceptually be described herein.

As the planar light-emitting tile 2 according to the present invention, a conventional light source, for example, a one arranged in plane with a plurality of LED light sources, and then covered with a diffuser, may be adopted. Preferably, the organic EL tile 6 is included. The present invention adopts, as a main member of the planar light-emitting tile 2, a translucent, rigid glass material having a fine steam barrier capability and an insulation property.

The planar light-emitting tile 2 according to the present invention uses the glass substrate 20 having a maximum thickness of 2 mm to achieve a lighter, thinner component, while, as a main purpose, its edges are appropriately protected.

Figure 8:
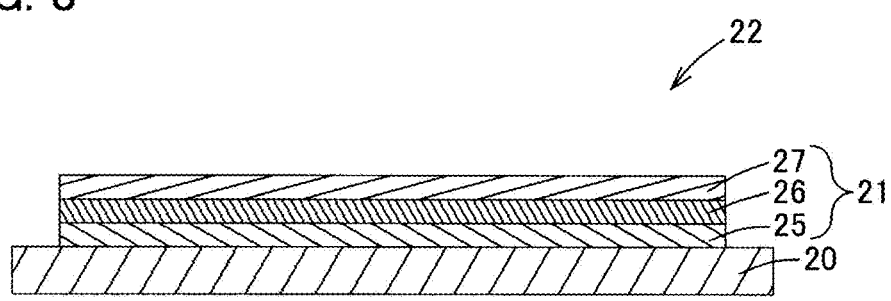
FIG. 8 is a cross-sectional view schematically illustrating an organic EL light-emitting element according to the present invention.

As shown in FIG. 8, for example, the organic EL tile 6 includes an organic EL light-emitting element 22 laminated with an organic EL light-emitting element layer 21 on the glass substrate 20. That is, as shown in FIG. 8, for example, the organic EL tile 6 is formed, on the glass substrate 20, by laminating the organic EL light-emitting element layer 21 that includes a translucent first electrode layer 25, a light-emitting function layer 26 including at least an organic compound, and a second electrode layer 27 in this order.

Figure 7A:
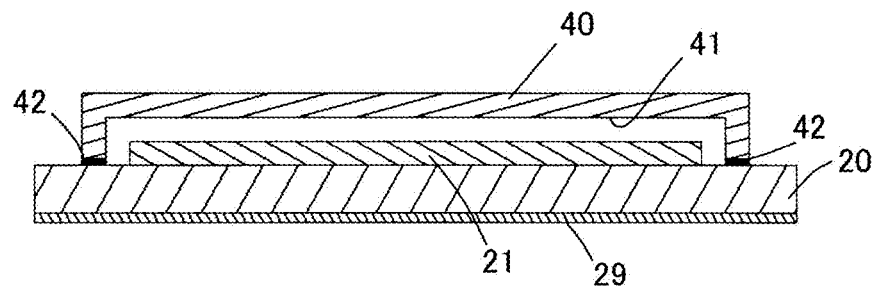
Figure 7B:
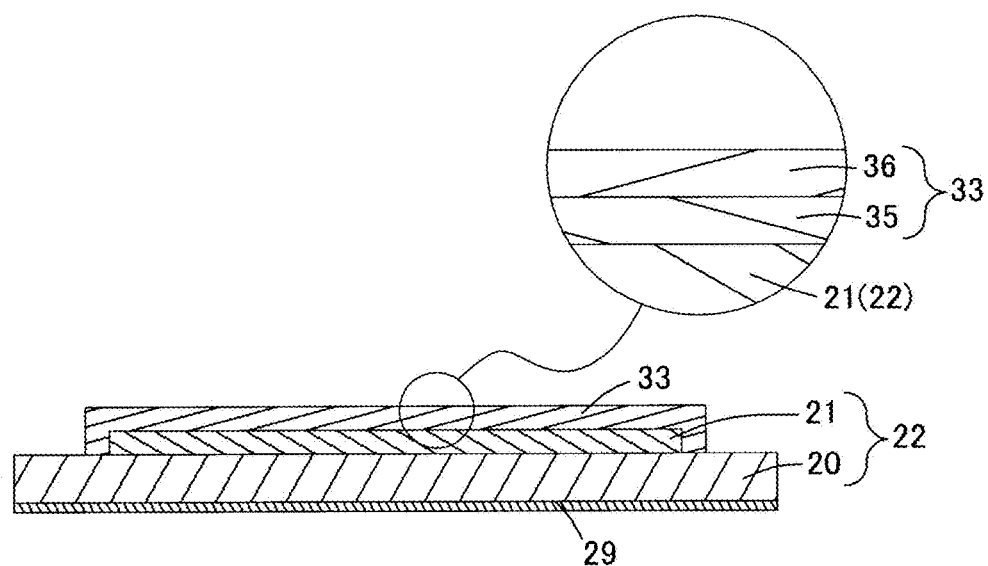

As shown in FIG. 7B, the organic EL tile 6 should preferably be formed with an inorganic sealing layer 33 that is in contact with the organic EL light-emitting element layer 21 so as to prevent moisture from being entered into the organic EL light-emitting element 22.

With a plurality of light-emitting layers provided as the light-emitting function layer 26 of the organic EL light-emitting element layer 21, for example, the organic EL tile 6 can emit light in spectrums having a plurality of broad peaks in a visible range so as to be a high color rendering light source. That is, the organic EL tile 6 can illuminate an illumination-target body in a beautiful hue similar to natural light.

From these viewpoints, the organic EL light-emitting element 22 of the organic EL tile 6 according to the present invention should preferably be a white light-emitting element that emits light in white when driven. In that case, for example, the white elastic jacket 3 can easily be produced by adding a white pigment in a material of the elastic jacket 3. That is, the white elastic jacket 3 according to the present invention is preferably utilized so that the planar light-emitting panel 1 can be seen in white as a whole.

With the elastic jacket 3 that reflects light irregularly, the planar light-emitting panel 1 equipped with the white elastic jacket 3 further adds a function of improving brightness as a whole.

The translucent first electrode layer 25 is a layer made of a translucent conductive material, preferably a metallic oxide material. The first electrode layer 25 may in particular preferably be made of one or more materials selected from a group consisting of indium tin oxide (ITO), indium zinc oxide (IZO), tin oxide ($SnO_2$), and zinc oxide (ZnO). In a viewpoint of effectively taking out light emitted from a thin film organic light-emitting layer, the first electrode layer 25 may preferably be made of a highly translucent ITO or IZO, more preferably ITO. The first electrode layer 25 may preferably be film-formed through a sputtering method or a CVD method.

In a viewpoint of producing a highly efficient white light-emitting element, the light-emitting function layer 26 of the organic EL light-emitting element layer 21 may preferably contain a plurality of light-emitting layers. A light-emitting layer containing an organic compound is a layer that actually emits light in the light-emitting function layer 26 sandwiched between the electrode layers 25 and 27.

An ordinary organic EL light-emitting element material can be used for the light-emitting function layer 26. Such materials include, for example, known low molecular pigment materials and conjugated polymer materials. Although organic compounds such as a polymer or an oligomer may be formed by coating, each layer should preferably be formed by depositing a film with a vacuum deposition method. Thus, the planar light-emitting panel 1 can become a high performance light-emitting panel.

The light-emitting function layer 26 may preferably be a multiply-laminated layer structure having a plurality of layers including a hole injection layer, a hole transport layer, a light-emitting layer, an electron transport layer, and an electron injection layer.

These layers configuring the light-emitting function layer 26 can be formed by appropriately combining known methods such as a vacuum deposition method, a sputtering method, a CVD method, a dipping method, a roll coating method (printing method), a spin coating method, a bar coating method, a spray method, a die coating method, and a flow coating method.

The second electrode layer 27 may preferably be a metallic thin film made of aluminum, silver, or other materials, and be formed by depositing a film with a vacuum deposition method.

The organic EL light-emitting element 22 may preferably be sealed to prevent moisture from being entered externally. That is, the organic EL tile 6 should preferably have a sealing structure for sealing the organic EL light-emitting element 22.

The organic EL light-emitting element 22 may be sealed through a sealing method such as cap sealing or solid film sealing. The organic EL light-emitting element 22 may be sealed by combining these sealing methods.

The cap sealing includes glass cap sealing and metallic cap sealing.

For this glass cap sealing, a flat glass plate with a concaved recess 41 as shown in FIG. 7A, i.e. a sealing glass 40, is used, and the recess 41 of the sealing glass 40 covers the organic EL light-emitting element layer 21 and other components.

For this glass cap sealing, the sealing glass 40 and the glass substrate 20 may be sealed with a glue, or, as shown in FIG. 7A, fused and sealed with a glass frit 42.

On the other hand, in metallic cap sealing, a flat metallic plate formed with a similar recess is used to make a sealing metallic plate, and the recess of the sealing metallic plate covers the organic EL light-emitting element layer 21 and other components.

In this metallic cap sealing, the sealing metallic plate and the glass substrate 20 may be sealed with a glue.

In these cap sealing, a moisture collecting material may be disposed inside a cap when required.

In solid film sealing, as shown in FIG. 7B, a sealing layer 28 (protective film) is, in some cases, formed on the organic EL light-emitting element 22 for sealing.

In solid film sealing, the sealing layer 28 (sealing film) may be either an inorganic film or an organic film, but, preferably, may be an inorganic sealing layer 33. In addition to deposition and sputtering, the inorganic sealing layer 33 may preferably be formed of a silicon alloy layer such as a silicon nitride film through a chemical vapor deposition method (CVD method).

In a viewpoint of preventing moisture from being entered into the organic EL light-emitting element 22, the inorganic sealing layer 33 should preferably have an average layer thickness in a range from 1 μm to 10 μm. As shown in FIG. 7B, the inorganic sealing layer 33 may preferably be formed by laminating two layers: a nitrogen-containing silicon alloy layer 35 and an oxygen-containing silicon alloy layer 36 in the order from the organic EL light-emitting element 22. The ratio of alloy layers 35 and 36 should be a range from 1:2 to 2:1.

Figure 14:
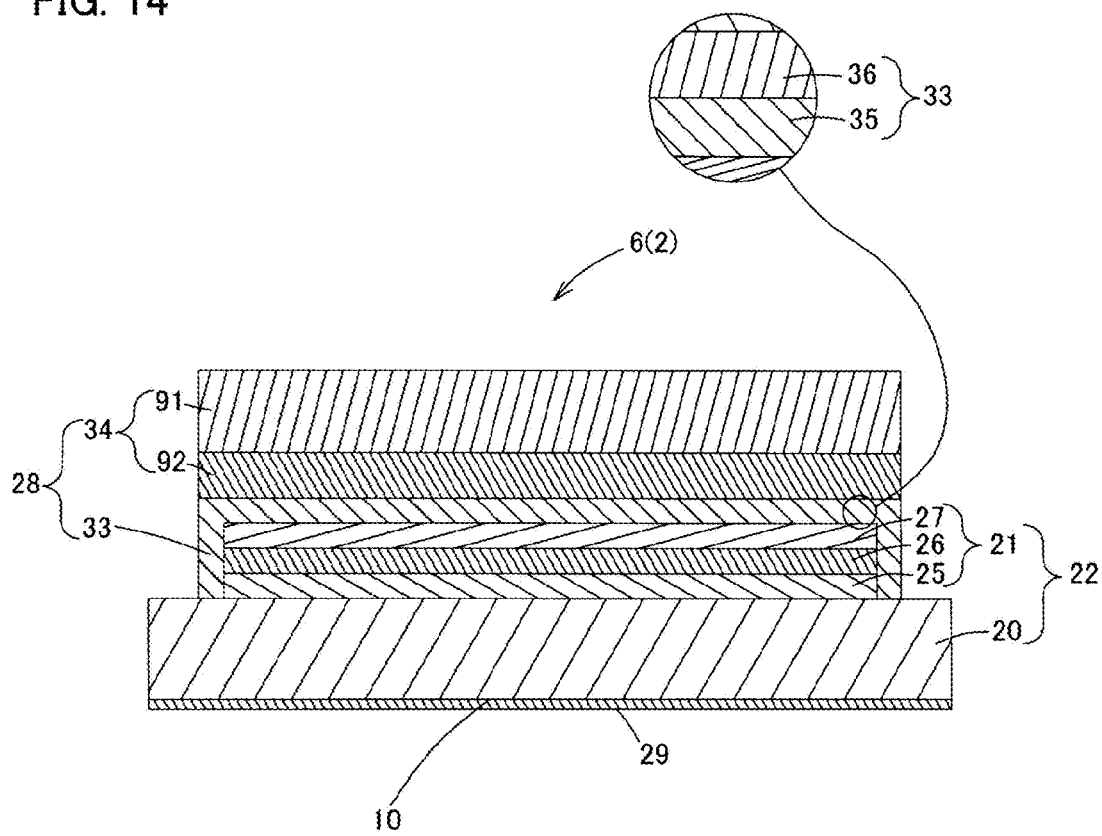
FIG. 14 is a cross-sectional view of an organic EL light-emitting tile shown in FIG. 11.

In solid film sealing, as shown in FIG. 14, as the exterior layer 4 or in addition to the exterior layer 4, a protective film such as a PET film, a steel plate, or a similar material should preferably be applied with a glue or an adhesive for preventing damage due to a mechanical external force. In a viewpoint of providing a highly reliable panel, an adhesive layer 92 should preferably be used.

In a viewpoint of fully achieving a function of an adhesive configuring the adhesive layer 92 in relation to the inorganic sealing layer 33, the adhesive layer 92 should preferably have an average thickness greater than an average thickness of the inorganic sealing layer 33.

In a viewpoint of its viscoelasiticity, an adhesive material configuring the adhesive layer 92 should preferably be one or more material selected from a group of rubber materials, acrylic materials, and silicone materials, and should more preferably be an acrylic material offering superior wettability. An adhesive material configuring the adhesive layer 92 should further preferably show fine viscoelasiticity with a storage modulus that is in a range from 103 Pa to 106 Pa, when measured at a temperature in a range of 0° C. to 50° C., and a frequency of 1 Hz, and that is a value between 0.02 times and 0.2 times of a measured storage modulus value.

The planar light-emitting tile 2 includes a wiring member (not shown) for supplying electric power to the organic EL light-emitting element 22 included in the planar light-emitting tile 2. Lead wires, copper foil, aluminum foil, FPC, ACF, or another material may be used as a power supply member.

Soldering or crimping may be used to electrically connect a power supply pad disposed on the glass substrate 20 or on an extending portion extended from the first electrode layer 25 with the power supply member, the power supply pad with other members, and the power supply member with other members.

As shown in FIGS. 7A and 7B, for example, the planar light-emitting tile 2 may preferably have a resin layer 29 on a light-emitting side surface of the glass substrate 20 for improved characteristics such as brightness, color, and angular dependence. That is, the planar light-emitting tile 2 should preferably have the resin layer 29 as a prime surface of the emission surface 10. In other words, the resin layer 29 according to the present invention should preferably be formed on a main face of the glass substrate 20.

Various methods may be used to form the resin layer 29, such as a method by applying a resin consisting of an acryl material on a glass surface for nanoimprinting, and a method of spray-coating or slit-coating a resin including glass beads. It is preferable that one side of the resin layer added with an adhesive (adhesive material) is applied onto glass, while the other side is provided with a resin film (optical film) having a fine uneven structure on its surface. That is, an optical film provided with an adhesive (adhesive material) on one side, and a fine uneven surface on another side should preferably be used as the resin layer 29.

The optical film may further preferably have a light scattering property. A film surface could easily be damaged during application of this optical film. To prevent the film surface from being damaged, the optical film should preferably be applied, when required, after the organic EL light-emitting element 22 is formed, and a wiring member is installed. The optical film should more preferably be applied after the organic EL light-emitting element 22 is formed, and the exterior layer 4 is attached.

The exterior layer 4 according to the present invention may be formed with a material such as a metallic material or a plastic material. In a viewpoint of utilizing its thin thickness of the planar light-emitting panel 1 where a weight is reduced, the planar light-emitting panel 1 may preferably be a resin film. The exterior layer 4 according to the present invention may preferably be disposed to abut on jacket side protrusions 81 protruding portion of the casing B according to the present invention. The planar light-emitting tile 2 having the exterior layer 4, according to the present invention, should more preferably be covered with the elastic jacket 3 having the casing B with protrusions, according to the present invention.

Between the exterior layer 4 and the organic EL light-emitting element 22, a high thermal conductive sheet may preferably be interposed to improve uniformity of in-surface brightness by reducing in-surface temperature distribution on the organic EL light-emitting element 22.

A magnetic sheet may be used as the exterior layer 4 so as to detachably attach, through its magnetism, the planar light-emitting panel 1 onto an application-target surface of the magnetic sheet. In a viewpoint of making the planar light-emitting panel 1 highly reliable, an adhesive layer may further preferably be interposed between the exterior layer 4 and the inorganic sealing layer 33.

In this case, a double sided tape having, at least on its either surface, an adhesive layer can preferably be used for attaching the exterior layer 4 onto the inorganic sealing layer 33 according to the present invention to reduce work human hours. With such a double sided tape, the exterior layer 4 may preferably be applied almost entirely on a back (rear face) of the organic EL tile 6 according to the present invention.

Next, the planar light-emitting tile 2 according to the first embodiment of the present invention will now be described herein. Components similar or identical to the above described components are described briefly with identical symbols applied.

The planar light-emitting tile 2 is a white light-emitting tile having the emission surface 10 that emits light in white. The planar light-emitting tile 2 is configured by, as shown in FIG. 10, the organic EL tile 6, the exterior layer 4, the adhesive member 5, and the double sided tapes 95.

The organic EL tile 6 includes the organic EL light-emitting element 22 built on the glass substrate 20.

The organic EL light-emitting element 22 is an element formed by laminating, as shown in FIG. 14, the organic EL light-emitting element layer 21 on the glass substrate 20, and is a white light-emitting element that emits light in white.

The organic EL light-emitting element layer 21 is a layer that actually emits light in the organic EL light-emitting element 22, and is formed by laminating, as shown in FIG. 14, the first electrode layer 25, the light-emitting function layer 26, and the second electrode layer 27 in the order from the glass substrate 20. In the organic EL tile 6, the sealing layer 28 is laminated on the organic EL light-emitting element layer 21 for sealing.

The glass substrate 20 is, as described above, a base substrate of the organic EL tile 6, and is a thin glass plate having a maximum average thickness of 2 mm. That is, the glass substrate 20 is an elastic substrate that elastically deforms at a certain degree.

The first electrode layer 25 is a translucent conductive layer made of a translucent conductive material, and is a translucent electrode layer served as an electrode of the organic EL light-emitting element 22.

The light-emitting function layer 26 is a layer including a thin film organic light-emitting layer containing an organic compound. This thin film organic light-emitting layer is a light-emitting layer that actually emits light in the light-emitting function layer 26 sandwiched between the electrode layers 25 and 27.

In a viewpoint of producing a highly efficient white light-emitting element, the light-emitting function layer 26 may preferably be the organic EL light-emitting element layer 21 including a plurality of thin film organic light-emitting layers.

The light-emitting function layer 26 includes a light-emitting unit having a multiply-laminated layer structure formed with a plurality of layers including a hole injection layer, a hole transport layer, a light-emitting layer, an electron transport layer, and an electron injection layer.

The light-emitting function layer 26 may preferably have a multiple-unit layered structure formed by laminating a plurality of the light-emitting units.

The second electrode layer 27 is a metallic layer formed of metallic material, and is a metallic electrode layer, opposite to the first electrode layer 25.

The sealing layer 28 is configured by, as shown in FIG. 14, the inorganic sealing layer 33 and a protective film 34.

The inorganic sealing layer 33 is a silicon alloy layer formed on the organic EL light-emitting element layer 21. The inorganic sealing layer 33 is, as shown in an enlarged view in FIG. 14, a layer laminated with the nitrogen-containing silicon alloy layer 35 and the oxygen-containing silicon alloy layer 36 in the order from the organic EL light-emitting element layer 21.

The protective film 34 has, as shown in FIG. 14, a film body 91 and the adhesive layer 92 (an adhesive material).

The film body 91 is a gas impermeable sealing film, and specifically a resin film.

As long as gas impermeability is secured, the film body 91 is not specifically limited, but may be a film made of, for example, polyethylene terephthalate (PET).

With its adhesiveness, the adhesive layer 92 is interposed between the inorganic sealing layer 33 and the film body 91 to attach the film body 91 onto the inorganic sealing layer 33. Specifically, the adhesive layer 92 is a double sided tape.

The planar light-emitting tile 2 includes a power supply member (not shown) that is a wiring member for supplying electric power to the organic EL light-emitting element layer 21 built into the planar light-emitting tile 2.

As for the front face of the planar light-emitting tile 2, the planar light-emitting tile 2 is formed by attaching or laminating the resin layer 29 on the emission surface 10 of the glass substrate 20.

Figure 11:
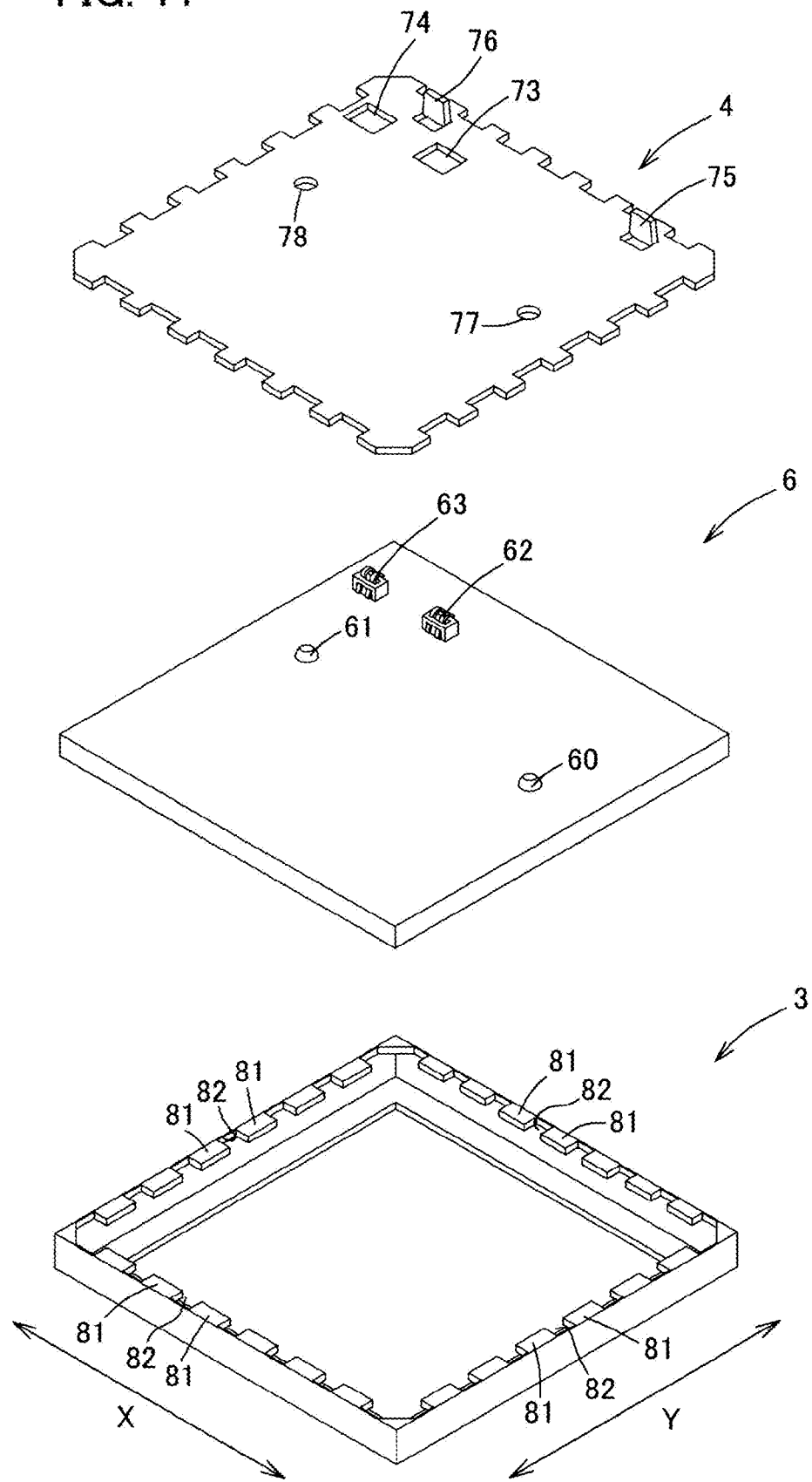
FIG. 11 is a perspective view where the planar light-emitting panel shown in FIG. 10 is further exploded.

On the other hand, as for the rear face of the organic EL tile 6, the organic EL tile 6 is provided with, as shown in FIG. 11, on the rear face, positioning projections 60 and 61, and power supply terminals 62 and 63.

The positioning projections 60 and 61 protrude from the organic EL tile to prevent the exterior layer 4 from being misaligned. The positioning projections 60 and 61 are arranged at a predetermined interval in a horizontal direction X, and are upright in an identical direction. That is, the positioning projections 60 and 61 are disposed to protrude rearward from the rear face.

The power supply terminals 62 and 63 are terminals connected to the electrode layers 25 and 27 of the organic EL light-emitting element 22 via the above described power supply member (not shown). That is, the power supply terminal 62 is electrically connected to the first electrode layer 25, while the power supply terminal 63 is electrically connected to the second electrode layer 27. When a voltage is applied between the power supply terminals 62 and 63, current can therefore flow into the light-emitting function layer 26 of the organic EL light-emitting element 22.

The exterior layer 4 is a layer forming part of an exterior of the planar light-emitting panel 1, and is a polygonal, metallic or resin sheet body expanding in plane.

The exterior layer 4 according to the embodiment is a metallic, thin plate or film having a ferromagnetic characteristic. Specifically, the exterior layer 4 is a steel, thin plate.

The exterior layer 4 can reinforce the glass substrate 20 together with the elastic jacket 3.

Figure 15:
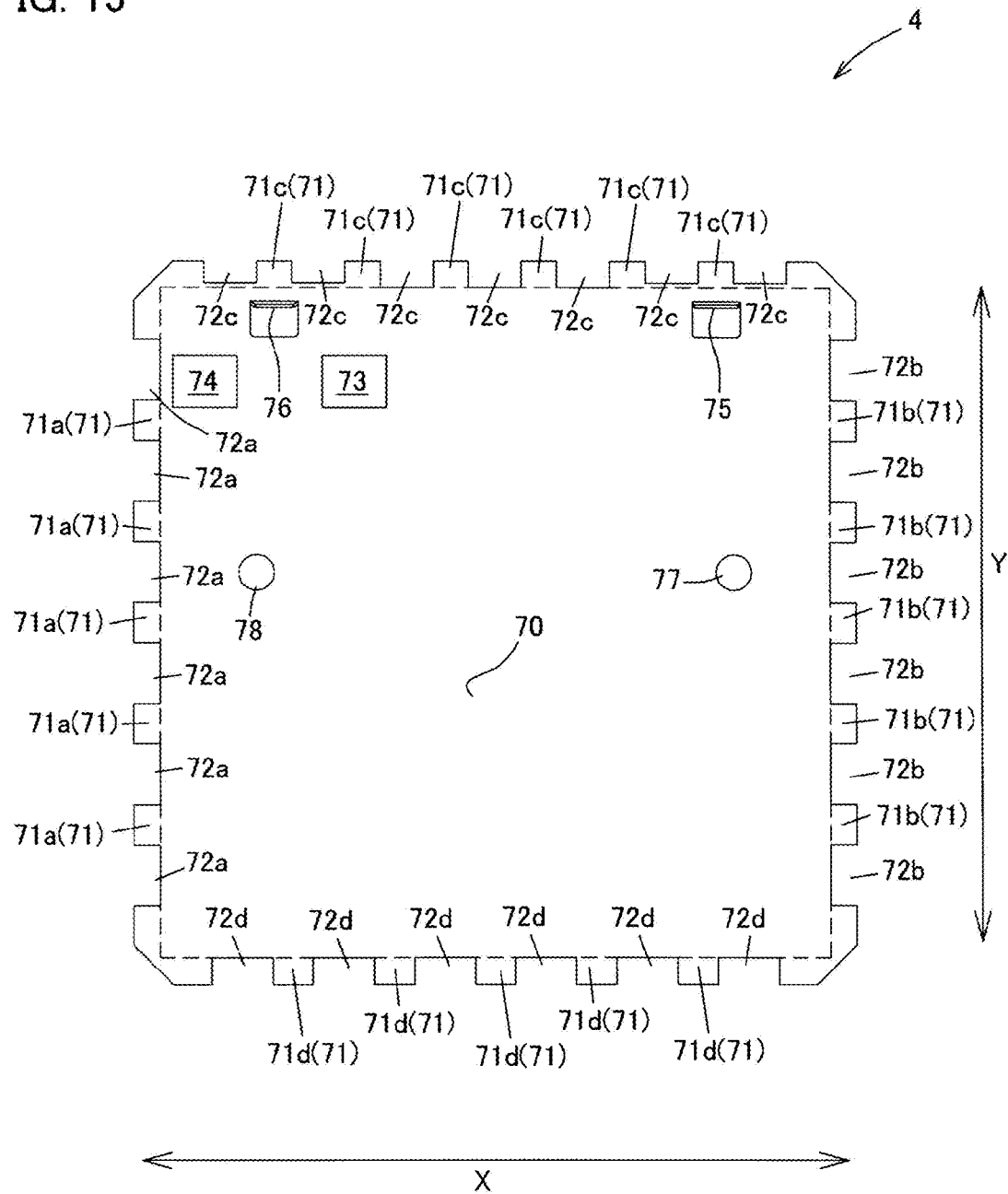
FIG. 15 is a rear view of an exterior layer shown in FIG. 11.

The exterior layer 4 is, as shown in FIG. 15, when viewed from rear, an approximately rectangular member, where an outer circumference is roughly formed by four sides, i.e. two opposing sides, and remaining two opposing sides.

The exterior layer 4 includes a main body 70, and a plurality of exterior layer side protrusions 71 protruding outward from an outer circumferential edge of the main body 70.

The main body 70 is an approximately rectangular portion, similar to the organic EL tile 6, and covers most of the rear face of the organic EL tile 6. The main body 70 includes power supply through holes 73 and 74, position adjusters 75 and 76, and positioning holes 77 and 78.

The power supply through holes 73 and 74 are approximately rectangular through holes passing through the main body 70 in a member thickness direction, into which the power supply terminals 62 and 63 of the organic EL tile 6 can be inserted.

The position adjusters 75 and 76 are members for fixing the planar light-emitting panel 1 onto a wall or similar structure. The position adjusters 75 and 76 are pieces partially cut and raised from the main body 70, and are portions raised relative to another portion of the main body 70.

The position adjusters 75 and 76 are arranged in an identical straight line at a predetermined interval in the horizontal direction X. In the embodiment, the position adjusters 75 and 76 are respectively disposed near both ends in the horizontal direction X, and near either end in a vertical direction Y.

The positioning holes 77 and 78 are through holes or bottomed holes into which the positioning projections 60 and 61 of the organic EL tile 6 can be inserted, and have a shape approximately identical to bases of the positioning projections 60 and 61.

The positioning holes 77 and 78 are arranged in an identical straight line at a predetermined interval in the horizontal direction X. In the embodiment, the positioning holes 77 and 78 are disposed at a center of the planar light-emitting panel in the vertical direction Y, and at positions respectively close to the both ends of the planar light-emitting panel in the horizontal direction X.

The exterior layer side protrusions 71 each have a rectangular shape, and arranged at predetermined intervals in a circumferential direction along the outer circumferential edge of the main body 70.

Specifically, the five exterior layer side protrusions 71 are provided on respective longitudinal sides of the main body 70, while the five exterior layer side protrusions 71 are provided on either lateral side of the main body 70, and the six exterior layer side protrusions 71 are provided on the other lateral side.

Exterior layer side protrusions 71a and 71b configuring part of the longitudinal sides of the exterior layer 4 are respectively separated and arranged in parallel in the vertical direction Y.

The exterior layer side protrusions 71a and 71a adjacent each other in a parallel direction (in the vertical direction Y) form exterior layer side recesses 72a together with an end side of the main body 70. The exterior layer side protrusions 71b and 71b adjacent each other in the parallel direction similarly form exterior layer side recesses 72b together with another end side of the main body 70.

The exterior layer side protrusions 71a and 71b belonging to the opposing longitudinal sides are respectively arranged in identical straight lines in the horizontal direction X, and protrude in directions toward which the exterior layer side protrusions come apart each other. In another viewpoint, the exterior layer side recesses 72a configured by the exterior layer side protrusions 71a and 71a adjacent each other in the vertical direction Y recess in a direction toward which the exterior layer side recesses 72a and the exterior layer side recesses 72b configured by the exterior layer side protrusions 71b and 71b adjacent each other in the vertical direction Y come close each other.

The exterior layer side protrusions 71a belonging to one of the longitudinal sides are identical in number to the exterior layer side protrusions 71b belonging to another one of the longitudinal sides. An interval between the adjacent exterior layer side protrusions 71a and 71a is identical to an interval between the adjacent exterior layer side protrusions 71b and 71b. That is, a width of each of the exterior layer side recesses 72a is identical to a width of each of the exterior layer side recesses 72b. A width of each of the exterior layer side protrusions 71a is also identical to a width of each of the exterior layer side protrusions 71b.

Exterior layer side protrusions 71c and 71d configuring parts of the lateral sides of the exterior layer 4 are respectively separated and arranged in parallel in the horizontal direction X.

The exterior layer side protrusions 71c and 71c adjacent each other in a parallel direction (the horizontal direction X) form the exterior layer side recesses 72c together with one of the end sides of the main body 70. The exterior layer side protrusions 71d and 71d adjacent each other in the parallel direction similarly form exterior layer side recesses 72d together with another one of the end sides of the main body 70.

The exterior layer side protrusions 71c and 71d respectively belonging to the opposing lateral sides are alternately disposed in the horizontal direction X. The exterior layer side protrusions 71c and 71d protrude in the vertical direction Y so as to come apart each other. In another viewpoint, the exterior layer side recesses 72c configured by the exterior layer side protrusions 71c and 71c adjacent each other in the horizontal direction X recess in a direction toward which the exterior layer side recesses 72c and the exterior layer side recesses 72d configured by the exterior layer side protrusions 71d and 71d adjacent each other in the horizontal direction X come close each other.

The exterior layer side protrusions 71c belonging to one of the lateral sides is greater in number than the exterior layer side protrusions 71d belonging to another one of the lateral sides. An interval between the adjacent exterior layer side protrusions 71c and 71c is narrower than an interval between the adjacent exterior layer side protrusions 71d and 71d. That is, a width of each of the exterior layer side recesses 72c is narrower than a width of each of the exterior layer side recesses 72d. A width of each of the exterior layer side protrusions 71c is also narrower than a width of each of the exterior layer side protrusions 71d.

The exterior layer 4 is approximately identical in average thickness to the elastic jacket 3.

Figure 12:
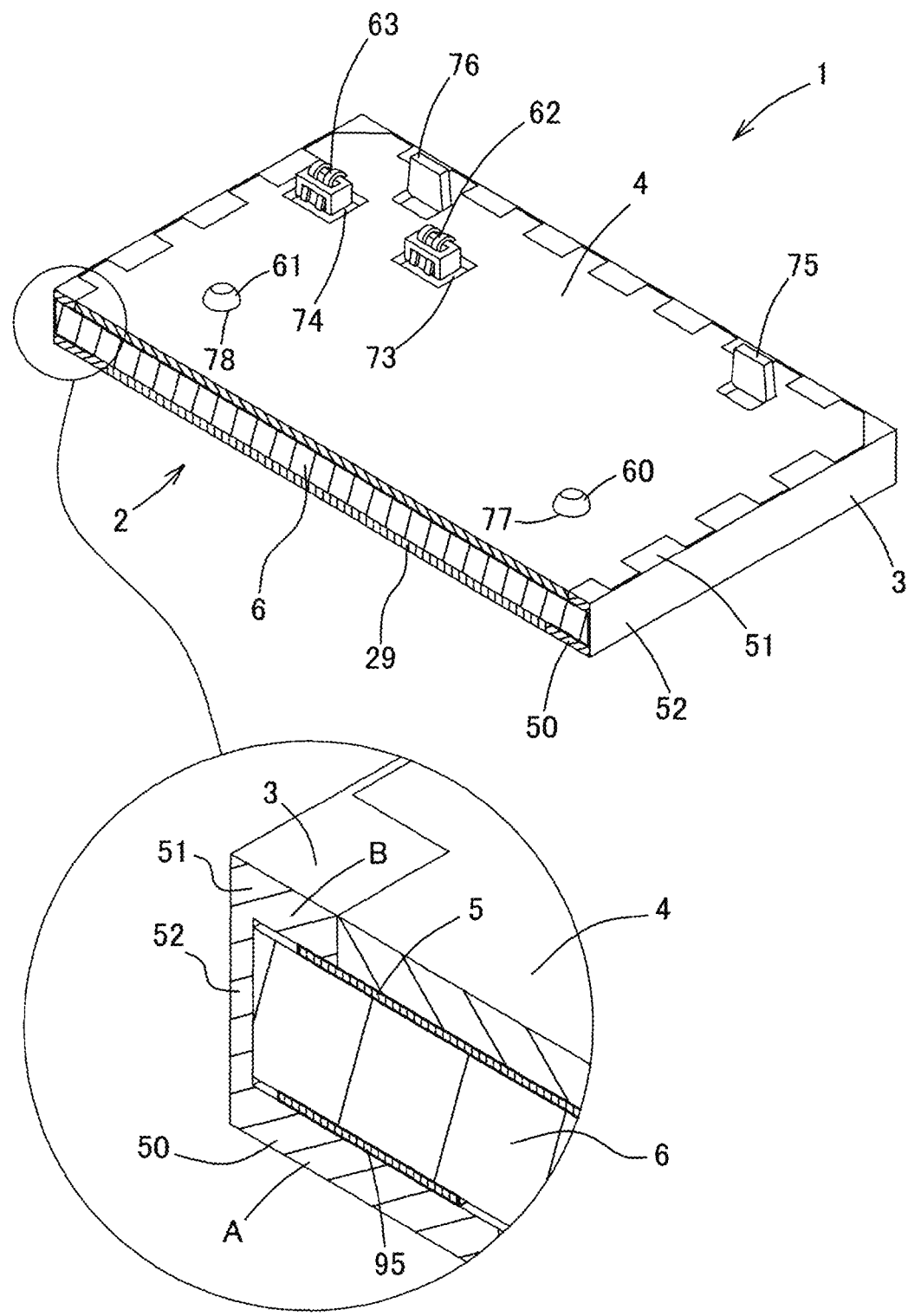
FIG. 12 is a cross-sectional, perspective view of the planar light-emitting panel shown in FIG. 9.

The adhesive member 5 is, as shown in an enlarged view in FIG. 12, a tape having on a side of a substrate an adhesive layer made of an adhesive, and specifically a double sided tape having adhesive layers on both sides of the substrate.

(Elastic Jacket 3)

The elastic jacket 3 according to the present invention will now conceptually be described herein.

The elastic jacket 3 covers a whole circumference of the glass substrate 20 according to the present invention. In other words, side faces of the glass substrate 20 according to the present invention are all covered by the elastic jacket 3 according to the present invention.

The elastic jacket 3 according to the present invention is configured by a light-emitting side cover 50 (front face side cover) forming one of main faces, a rear face side cover 51 forming another one of the main faces, and a side cover 52 forming planar side faces. In the elastic jacket 3, the light-emitting side cover 50 forming the one of the main faces and the rear face side cover 51 forming the other one of the main faces are continuously coupled, on a whole circumference of the elastic jacket 3, by the side cover 52 forming the planar side faces.

The light-emitting side cover 50 forming the one of the main faces includes the planar light-emitting region 37 of the planar light-emitting tile 2, and has a light-emitting side opening portion 53 similar in form to an external form of the planar light-emitting region 37. That is, in the light-emitting side cover 50, as shown in FIG. 13, when viewed from front, the light-emitting side opening portion 53 includes all the light-emitting regions 38 of the planar light-emitting tile 2, and an entire area including all the light-emitting regions 38 of the planar light-emitting tile 2 is generally referred to as the planar light-emitting region 37. That is, the planar light-emitting region 37 is an only and single "planar light-emitting region" for the planar light-emitting tile 2.

The planar light-emitting region 37 therefore may include, as shown in FIG. 13, a plurality of sub-light-emitting regions 38 separated each other. In other words, for example, when the planar light-emitting tile 2 includes a distributed plurality of the small-pieced light-emitting regions 38, a maximum area including all the light-emitting regions 38 (an area formed by joining outlines) is referred to as the planar light-emitting region 37.

As described above, the light-emitting side cover 50 forming the one of the main faces is, as an entity, a casing A (casing 31) lying around the light-emitting side opening portion 53.

The rear face side cover 51 forming the other one of the main faces has at its center a rear face side opening portion 55, where a closed external form line of the rear face side opening portion 55 surrounding its opening has a plurality of recesses (jacket side recesses 82). That is, the rear face side cover 51 forming the other one of the main faces is, as shown in FIGS. 1 and 2, as an entity, the rubber casing B (casing 32) that lies around the rear face side opening portion 55, and that includes protrusions (jacket side protrusions 81) corresponding to a plurality of recesses.

Figure 16:
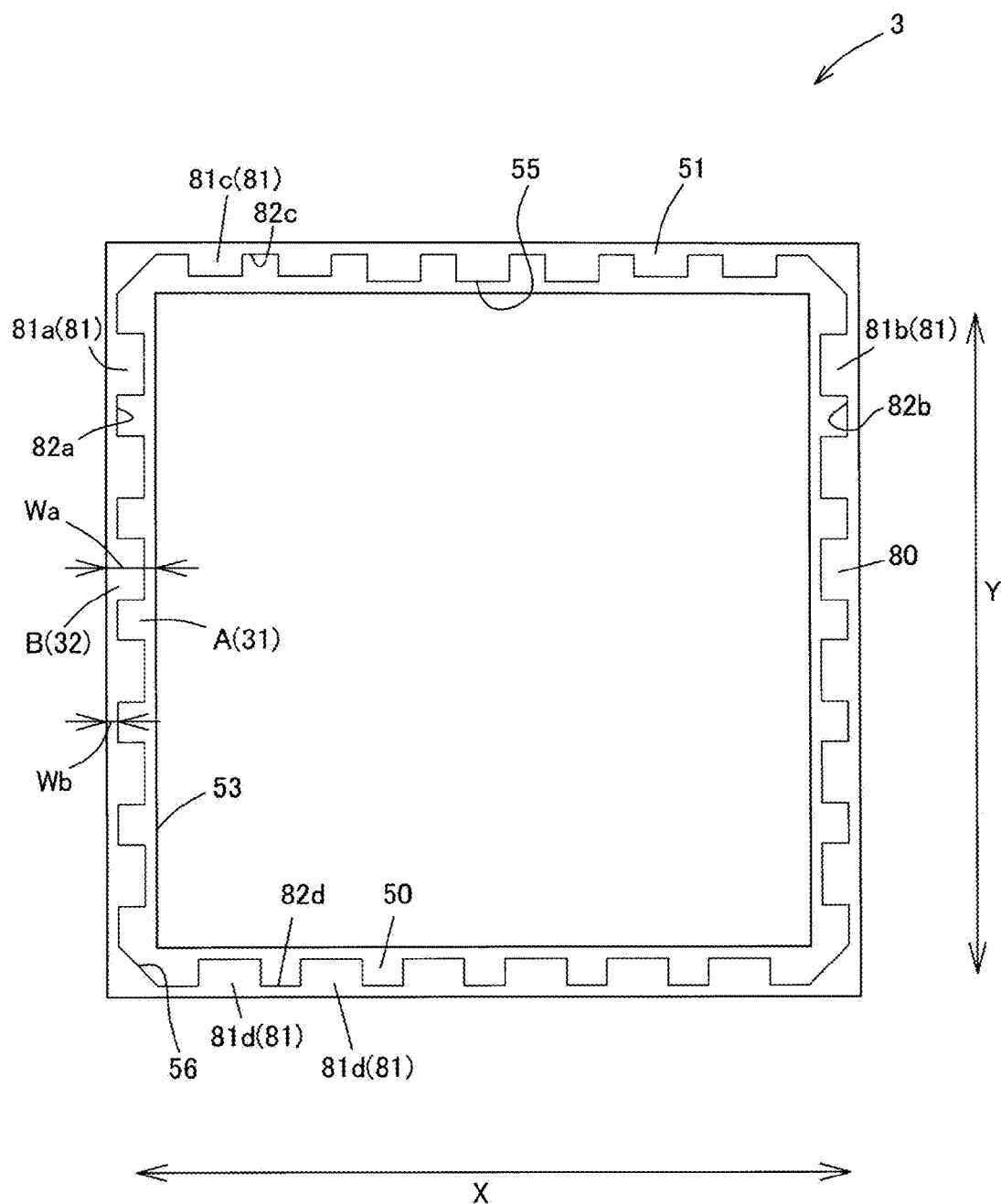
FIG. 16 is a rear view of an elastic jacket shown in FIG. 11.

As for the casing B, when a portion excluding the protrusions (the jacket side protrusions 81) is regarded as a band area, and its average width value is regarded to an average width Wb of the casing B, in the elastic jacket 3 according to the present invention, as shown in FIG. 16, an average width Wa of the casing A should preferably be wider than the average width Wb of the casing B. The elastic jacket 3 configured in such a manner can thus be a highly reliable edge protector, with its aesthetic appearance.

An average width of the casing B, including the jacket side protrusions 81, may be narrower than the average width Wa of the casing A.

The side cover 52 forming the planar side faces couples the light-emitting side cover 50 forming the one of the main faces and the rear face side cover 51 forming the other one of the main faces, and is perpendicular to both the main faces. The side cover 52 may preferably be side faces of an edge protection member made of a material identical to a material of the main faces, i.e. the frames, and be formed integrated.

As for the elastic jacket 3 according to the present invention, its size and shape are approximately identical to a size and shape of the planar light-emitting tile 2 so that C-channels respectively formed by the covers 50 and 51 respectively forming the main faces and the covers 52 forming the side faces appropriately fit. The elastic jacket 3 may preferably be reduced in size and shape, by taking into account stretch of rubber, for 0% to 30%, and more preferably for approximately 3%. A rubber material of the elastic jacket 3 may be natural rubber, and may preferably be chemically stable silicone rubber. Such a rubber material of the elastic jacket 3 may preferably include a white pigment.

The elastic jacket 3 is attached over the planar light-emitting tile 2 that is provided with the exterior layer 4.

A steel plate provided with protrusions and recesses beforehand on its external form is used, for example, as the exterior layer 4, to attach the casing B so that the protrusions and the recesses of the casing B fit protrusions and recesses of the exterior layer 4. With the double sided tape (the adhesive member 5) applied beforehand for joining the planar light-emitting tile 2 and the exterior layer 4 and exposed at outer circumference recesses (the exterior layer side recesses 72) of the exterior layer 4, the elastic jacket 3 and the planar light-emitting tile 2 can then be fixed around the rear face side opening portion 55. A highly reliable edge protection structure can thus be provided.

The casing A around the light-emitting side opening portion 53 should preferably be fixed, but may not be fixed. A glue agent or an adhesive may be used for fixation, or, before placing the elastic jacket 3, the double sided tapes 95 may be applied on a portion, onto which the casing A will be placed, of a surface of the planar light-emitting tile 2 for fixing the elastic jacket 3.

Next, the elastic jacket 3 according to the first embodiment of the present invention will now be described herein. Components similar or identical to the above described components are described briefly with identical symbols applied.

The elastic jacket 3 is an elastic edge protection member for protecting edges of the planar light-emitting tile 2. Specifically, the elastic jacket 3 is a rubber jacket. In a viewpoint of giving the impression as if the elastic jacket 3 emitted light in a color identical to an illumination color of the emission surface 10, the elastic jacket 3 should preferably be formed to include a white pigment so as to be substantially white.

The elastic jacket 3 is configured by, as shown in FIG. 12, the light-emitting side cover 50 (front face side cover), the rear face side cover 51, and the side cover 52.

The light-emitting side cover 50 and the rear face side cover 51 are continuously coupled on the whole circumference of the elastic jacket 3 via the side cover 52. That is, the elastic jacket 3 has a cross-sectional structure formed in a C-channel shape with the light-emitting side cover 50, the rear face side cover 51, and the side cover 52.

The light-emitting side cover 50 has, as shown in FIG. 13, the light-emitting side opening portion 53 having a similarity relationship with an external form of the planar light-emitting region 37. The light-emitting side opening portion 53 lies at a center, when viewed from front. That is, the light-emitting side cover 50 can also be referred to as the casing A lying around the light-emitting side opening portion 53.

The rear face side cover 51 has, as shown in FIG. 16, the rear face side opening portion 55 at a center, when viewed from rear. That is, the rear face side cover 51 is the casing B lying around the rear face side opening portion 55.

The rear face side cover 51 is configured by a casing part 80 and the jacket side protrusions 81 protruding from the casing part 80 toward a center side.

Together with the jacket side protrusions 81, the casing part 80 forms the rear face side opening portion 55, i.e. the casing part 80 is a casing portion surrounding the rear face side opening portion 55. The casing part 80 is substantially a portion formed by end faces of the side cover 52.

The jacket side protrusions 81 are rectangular plate portions each having a free end on a side, where another side of each of the jacket side protrusions 81 is coupled to the casing part 80. That is, the jacket side protrusions 81 can elastically deform in a thickness direction.

The jacket side protrusions 81 are arranged at predetermined intervals in a circumferential direction along end sides of the casing part 80. That is, the jacket side protrusions 81 are separated at the predetermined intervals along an opening edge of the rear face side opening portion 55. The jacket side protrusions 81 are also arranged in a ring shape along the casing part 80.

Jacket side protrusions 81*a* and 81*b* configuring part of the longitudinal sides of the rear face side cover 51 are respectively separated and arranged in parallel in the vertical direction Y.

The jacket side protrusions 81*a* and 81*a* adjacent each other in a parallel direction (in the vertical direction Y) form, when viewed from rear, jacket side recesses 82*a* together with one of the end sides of the casing part 80. That is, the jacket side recesses 82*a* are rectangular, cut-away portions sandwiched by the adjacent jacket side protrusions 81*a* and 81*a* in the parallel direction. Jacket side protrusions 81*b* and 81*b* adjacent each other in a parallel direction (in the vertical direction Y) similarly form, when viewed from rear, jacket side recesses 82*b* together with another one of the end sides of the casing part 80. That is, the jacket side recesses 82*b* are rectangular, cut-away portions sandwiched by the adjacent jacket side protrusions 81*b* and 81*b* in the parallel direction.

The jacket side protrusions 81*a* and 81*b* respectively belonging to the opposing longitudinal sides are arranged in identical straight lines in the horizontal direction X. The jacket side protrusions 81*a* and 81*b* protrude in directions so as to come close each other. In another viewpoint, the jacket side recesses 82*a* configured by the jacket side protrusions 81*a* and 81*a* adjacent each other in the vertical direction Y recess in a direction toward which the jacket side recesses 82*a* and the jacket side recesses 82*b* configured by the jacket side protrusions 81*b* and 81*b* adjacent each other in the vertical direction Y come apart each other.

The jacket side protrusions 81*a* belonging to one of the longitudinal sides are identical in number to the jacket side protrusions 81*b* belonging to another of the longitudinal sides. An interval between the adjacent jacket side protrusions 81*a* and 81*a* is identical to an interval between the adjacent jacket side protrusions 81*b* and 81*b*. That is, a width of each of the jacket side recesses 82*a* is identical to a width of each of the jacket side recesses 82*b*.

A width of each of the jacket side protrusions 81*a* is also identical to a width of each of the jacket side protrusions 81*b*.

Jacket side protrusions 81*c* and 81*d* configuring part of the lateral sides of the rear face side cover 51 are respectively separated and arranged in parallel in the horizontal direction X.

The jacket side protrusions 81*c* and 81*c* adjacent each other in a parallel direction (in the horizontal direction X) form, when viewed from rear, jacket side recesses 82*c* together with one of the end sides of the casing part 80. That is, the jacket side recesses 82*c* are rectangular, cut-away portions sandwiched by the adjacent jacket side protrusions 81*c* and 81*c* in the parallel direction. The jacket side protrusions 81*d* and 81*d* adjacent each other in a parallel direction (in the horizontal direction X) similarly form, when viewed from rear, the jacket side recesses 82*d* together with another one of the end sides of the casing part 80. That is, the jacket side recesses 82*d* are rectangular, cut-away portions sandwiched by the adjacent jacket side protrusions 81*d* and 81*d* in the parallel direction.

The jacket side protrusions 81*c* and 81*d* respectively belonging to the opposing lateral sides are alternately disposed in the horizontal direction X. The jacket side protrusions 81*c* and 81*d* protrude in the vertical direction Y so as to come close each other. In another viewpoint, the jacket side recesses 82*c* configured by the jacket side protrusions 81*c* and 81*c* adjacent each other in the horizontal direction X recess in a direction toward which the jacket side recesses 82*c* and the jacket side recesses 82*d* configured by the jacket side protrusions 81*d* and 81*d* adjacent each other in the horizontal direction X come apart each other.

The jacket side protrusions 81*c* belonging to one of the lateral sides are greater in number than the jacket side protrusions 81*d* belonging to another of the lateral sides (opposite side). An interval between the adjacent jacket side protrusions 81*c* and 81*c* is narrower than an interval between the adjacent jacket side protrusions 81*d* and 81*d*. That is, a width of each of the jacket side recesses 82*c* is narrower than a width of each of the jacket side recesses 82*d*.

A width of each of the jacket side protrusions 81*c* is also narrower than a width of each of the jacket side protrusions 81*d*.

The side cover 52 is a portion covering side end faces of the glass substrate 20.

The side cover 52 has side faces continuously or intermittently joining the light-emitting side cover 50 and the rear face side cover 51, and intersecting the light-emitting side cover 50 and the rear face side cover 51.

The side cover 52 is formed integrated with the light-emitting side cover 50 and the rear face side cover 51.

A thickness of the rear face side cover 51 may be thinner than thicknesses of the light-emitting side cover 50 and the side cover 52.

Next, a procedure for assembling the planar light-emitting panel 1 according to the first embodiment, and positional relationships between portions will now be described herein.

First attach a double sided tape, i.e. the adhesive member 5, along an outer circumference of the organic EL tile 6, and then attach the exterior layer 4. That is, attach the exterior layer 4 via the adhesive member 5 on the organic EL tile 6.

The exterior layer 4 is at this time attached, as shown in FIG. 12, by the adhesive member 5 onto the organic EL tile 6 so as to almost entirely cover the rear face of the organic EL tile 6. That is, the exterior layer 4 is attached via the adhesive member 5 on the protective film 34 of the sealing layer 28. The adhesive member 5 is partially exposed from the exterior layer side recesses 72 of the exterior layer 4.

The positioning projections 60 and 61 of the organic EL tile 6 are inserted into the positioning holes 77 and 78 of the exterior layer 4, thus the exterior layer 4 is prevented from being moved in a surface direction relative to the organic EL tile 6. The power supply terminals 62 and 63 of the organic EL tile 6 are inserted into the power supply through holes 73 and 74, and partially exposed from the power supply through holes 73 and 74.

In another process, apply one side of the double sided tapes 95 on the emission surface 10 of the planar light-emitting tile 2.

The double sided tapes 95 are at this time attached in a ring shape around the emission surface 10 so as not to overlap with the emission surface 10. Specifically, when the light-emitting panel 1 is assembled, the double sided tapes 95 are attached on the emission surface 10 of the planar light-emitting tile 2 so that the double sided tapes overlap with the rear face of the light-emitting side cover 50.

In still another process, attach the resin layer 29 so as to cover the emission surface 10 of the organic EL tile 6.

The front face of the planar light-emitting panel 1 is at this time covered with the resin layer 29 so as to block light from the planar light-emitting region 37.

After these processes, place the elastic jacket 3 from the emission surface 10 (front face) of the planar light-emitting tile 2 to attach with the double sided tapes 95 the light-emitting side cover 50 of the elastic jacket 3 onto the emission surface 10 of the planar light-emitting tile 2 to complete the planar light-emitting panel 1.

The elastic jacket 3 at this time covers an outer side of the planar light-emitting tile 2. That is, the elastic jacket 3 covers, when viewed from front, the whole circumference of the planar light-emitting tile 2, thus the elastic jacket 3 covers entirely the side faces of the glass substrate 20. That is, the elastic jacket 3 covers edge end faces of the glass substrate 20 to externally protect the glass substrate 20.

The elastic jacket 3 is at this time slightly smaller than the planar light-emitting tile 2, is as a whole stretched approximately 3%, and is attached to the planar light-emitting tile 2.

The jacket side protrusions 81 of the elastic jacket 3 are attached at this time onto the adhesive member 5 exposed from the exterior layer side recesses 72 of the exterior layer 4. The elastic jacket 3 and the planar light-emitting tile 2 are integrally fixed by the adhesive member 5 around the rear face side opening portion 55.

The elastic jacket 3 engages with exterior layer 4 attached to the rear face of the organic EL tile 6 in a surface direction. Specifically, side faces of the exterior layer side protrusions 71 of the exterior layer 4 engage with side faces of the jacket side protrusions 81 of the elastic jacket 3 in the surface direction and along a circumferential direction. That is, the exterior layer side protrusions 71 of the exterior layer 4 enter into the jacket side recesses 82 of the elastic jacket 3 to fit with the jacket side recesses 82, while the jacket side protrusions 81 enter into the exterior layer side recesses 72 to fit with the exterior layer side recesses 72.

The rear face of the exterior layer 4 forms a flat surface with the rear face of the rear face side cover 51 of the elastic jacket 3 so that both the rear faces have the same height.

The light-emitting side cover 50 of the elastic jacket 3 is attached with the double sided tapes that are attached onto the planar light-emitting tile 2.

The resin layer 29 is formed so as to cover the emission surface 10 of the organic EL tile 6, and, when viewed from front, resin layer 29 is disposed in the light-emitting side opening portion 53 of the elastic jacket 3.

In the planar light-emitting panel 1 according to the embodiment, since the emission surface 10 emits light in white, and the elastic jacket 3 is substantially white, light emitted from the emission surface 10 is irregularly reflected by the elastic jacket 3, thus brightness has been improved as a whole. The planar light-emitting panel 1 itself can entirely be seen bright, thus the emission surface 10 can be seen expanded.

In the planar light-emitting panel 1 according to the embodiment, each side of the rear face side cover 51 of the jacket 3 includes the plurality of jacket side recesses 82 and the plurality of jacket side protrusions 81, thus the jacket 3 is prevented from being removed or peeled off from the planar light-emitting tile 2.

Next, a design in accordance with this application will now be described herein.

So to speak, the planar light-emitting panel designed in accordance with this application is a lighting apparatus. That is, a product shown in FIGS. 17A to 17F, designed in accordance with this application, is a lighting apparatus attached for use on interior walls (including ceiling and floor) and furniture walls. The product is a planar light source equipped, on a side, with an emission surface to illuminate a living space therewith.

FIG. 17A is a front view of the lighting apparatus designed in accordance with this application. FIG. 17B is a rear view of the lighting apparatus designed in accordance with this application. FIG. 17C is a plan view of the lighting apparatus designed in accordance with this application. FIG. 17D is a bottom view of the lighting apparatus designed in accordance with this application. FIG. 17E is a right-side view of the lighting apparatus designed in accordance with this application. FIG. 17F is a left-side view of the lighting apparatus designed in accordance with this application.

Similar or identical to FIG. 17B, FIG. 18A is a rear view of the lighting apparatus designed in accordance with this application. FIGS. 18B, 18C, 18D, and 18E respectively are A-A cross-sectional view, B-B cross-sectional view, C-C cross-sectional view, and D-D cross-sectional view of FIG. 18A.

In the planar light-emitting panel designed in accordance with this application, the rear face of the jacket attached to the planar light-emitting tile is provided with an opening. Projections and recesses are regularly disposed on edges of the opening. The protrusions are all identical in shape, and the recesses are also all identical in shape.

The protrusions and the recesses respectively forming an uneven shape are respectively disposed at regular intervals.

Figure 19A:
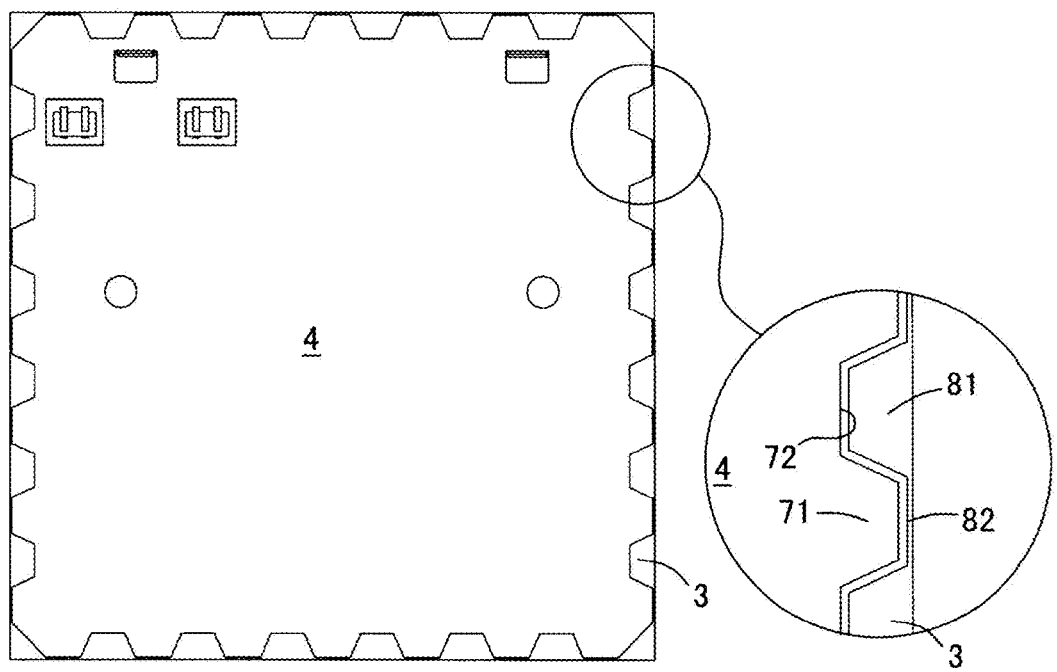
FIGS. 19A and 19B are rear views of planar light-emitting panels according to other embodiments of the present invention.
Figure 19B:
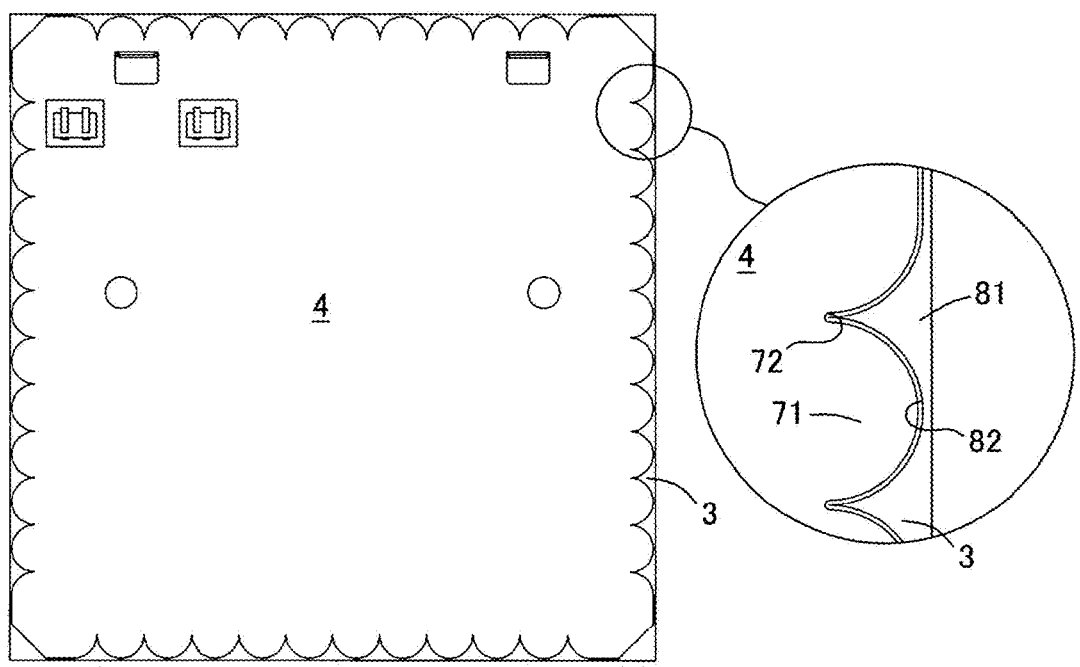

In the above described embodiment, the jacket side protrusions 81 and the jacket side recesses 82 are respectively formed in rectangular. However, the present invention is not limited to this embodiment. The jacket side protrusions 81 and the jacket side recesses 82 may respectively be formed in, for example, a trapezoidal shape, as shown in FIG. 19A, or a curved or semicircular shape, as shown in FIG. 19B.

Figure 20:
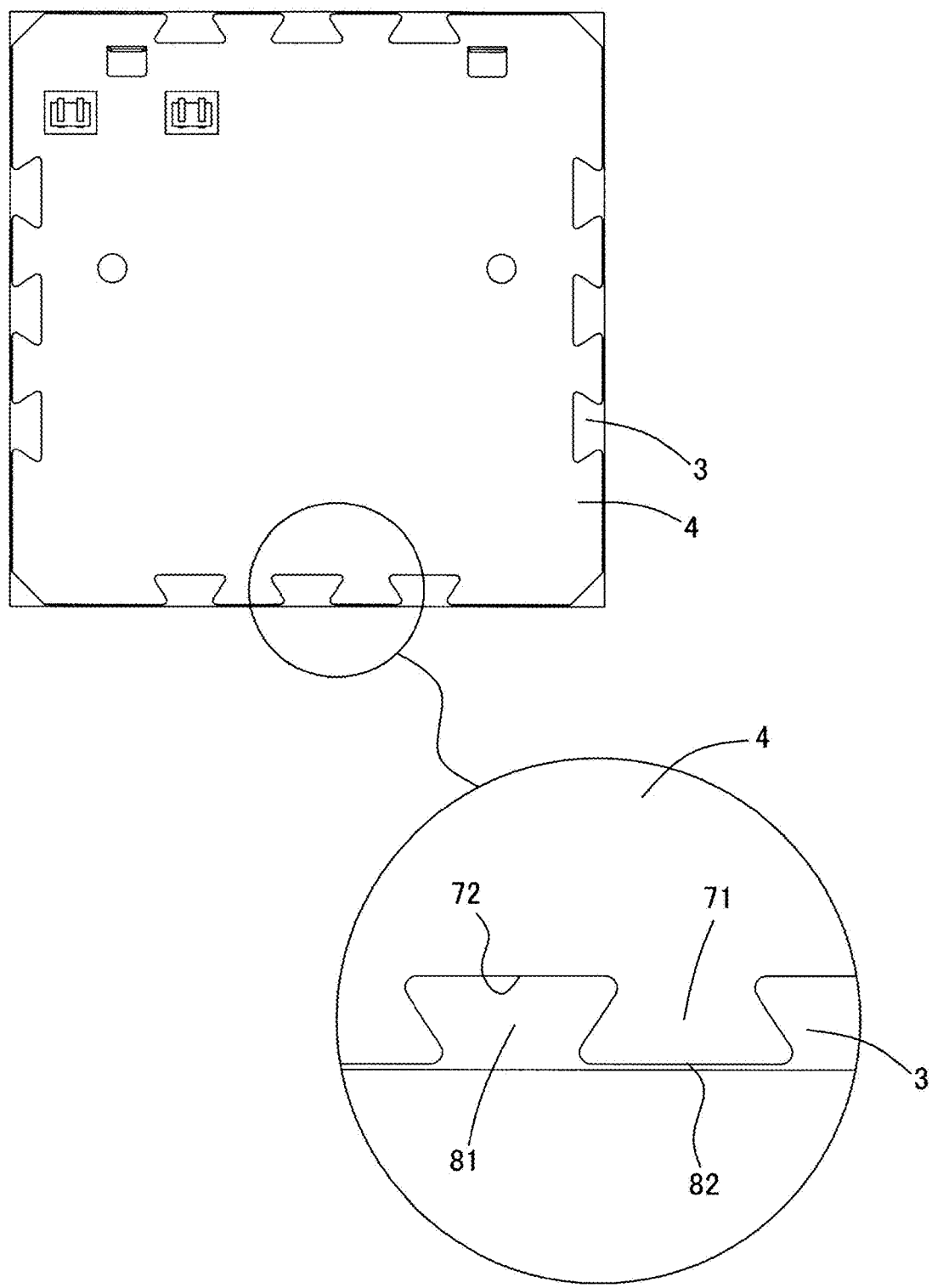
FIG. 20 is a rear view of a planar light-emitting panel according to still another embodiment of the present invention.

The jacket side protrusions 81 may respectively be gradually expanded in width from a base end to a tip in a protruding direction, as shown in FIGS. 4, 5, and 20. In other words, the jacket side recesses 82 may respectively be gradually narrowed in width from a base end to a tip in an evacuation direction.

Similarly, in the above described embodiment, the exterior layer side protrusions 71 and the exterior layer side recesses 72 are respectively formed in rectangular. However, the present invention is not limited to this embodiment. For example, the exterior layer side protrusions 71 and the exterior layer side recesses 72 may respectively be formed in a trapezoidal shape, a curved shape, or a semicircular shape.

The exterior layer side protrusions 71 may respectively be gradually expanded in width from a base end to a tip in a protruding direction. In other words, the exterior layer side recesses 72 may respectively be gradually narrowed in width from a base end to a tip in an evacuation direction.

Figure 21A:
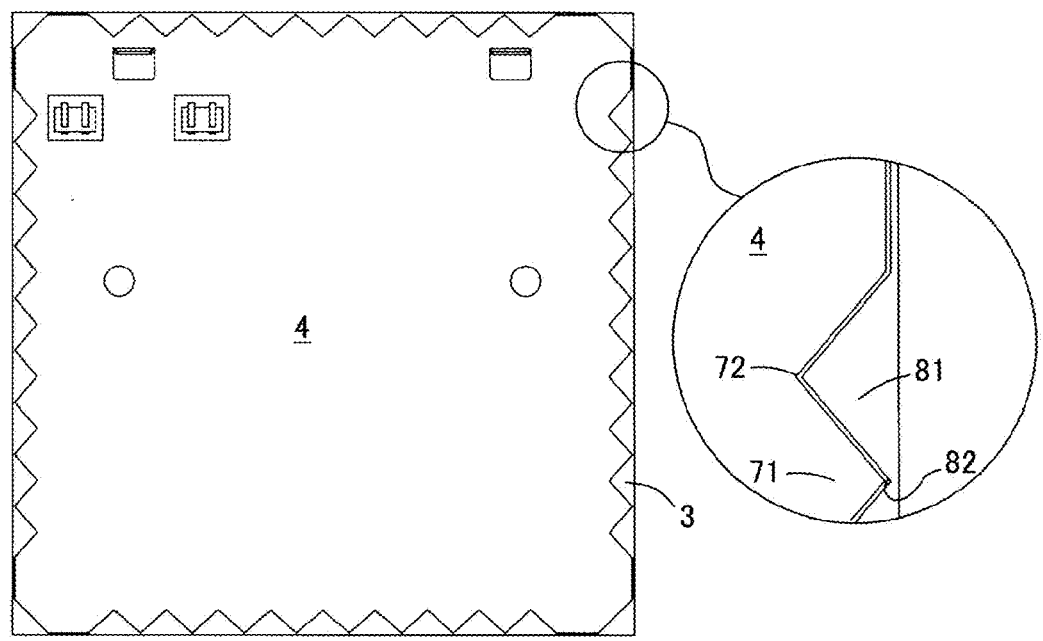
FIGS. 21A and 21B are rear views of planar light-emitting panels according to still other embodiments of the present invention.
Figure 21B:
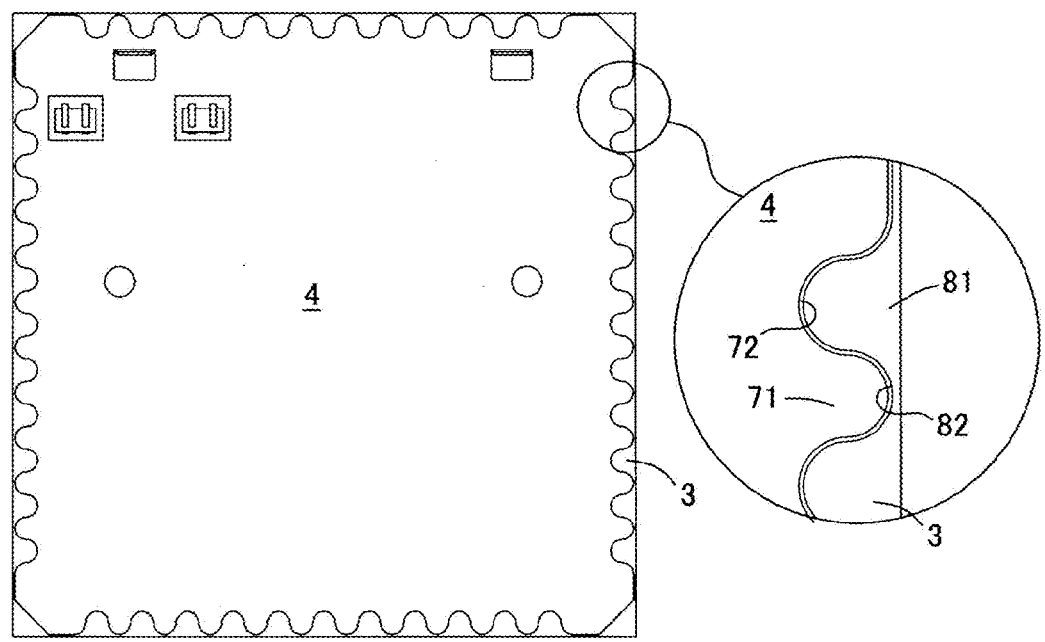

In the above described embodiment, the elastic jacket 3 has the rectangular jacket side protrusions 81 and the rectangular jacket side recesses 82 continuously arranged along the outer circumference. However, the present invention is not limited to this embodiment. As shown in FIG. 21A, for example, triangular jacket side protrusions and triangular jacket side recesses may be continuously arranged along the outer circumference, or, as shown in FIG. 21B, for example, semi-elliptical jacket side protrusions and semi-elliptical jacket side recesses may be continuously arranged along the outer circumference.

Similarly, in the above described embodiment, the exterior layer 4 has the rectangular exterior layer side protrusions 71 and the rectangular exterior layer side recesses 72 continuously arranged along the outer circumference. However, the present invention is not limited to this embodiment. For example, triangular exterior layer side protrusions and triangular exterior layer side recesses may be continuously arranged along the outer circumference, or, for example, semi-elliptical exterior layer side protrusions and semi-elliptical exterior layer side recesses may be continuously arranged along the outer circumference.

In the above described embodiment, the jacket side protrusions 81 and the exterior layer side recesses 72 fit each other. However, the present invention is not limited to this embodiment. The protrusions and the recesses should not always securely fit each other.

Figure 22A:
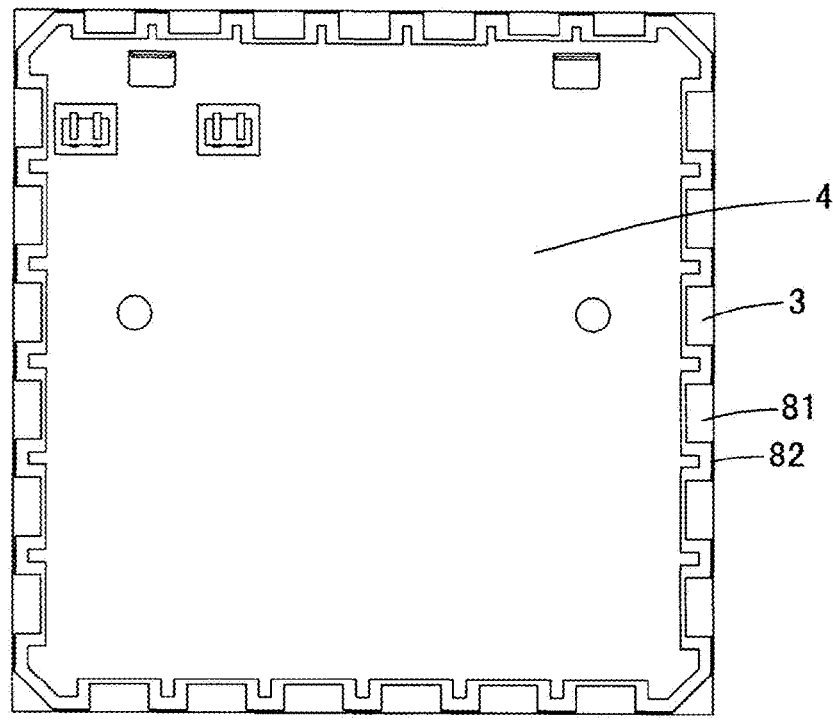
FIGS. 22A and 22B are rear views of planar light-emitting panels according to still other embodiments of the present invention.
Figure 22B:
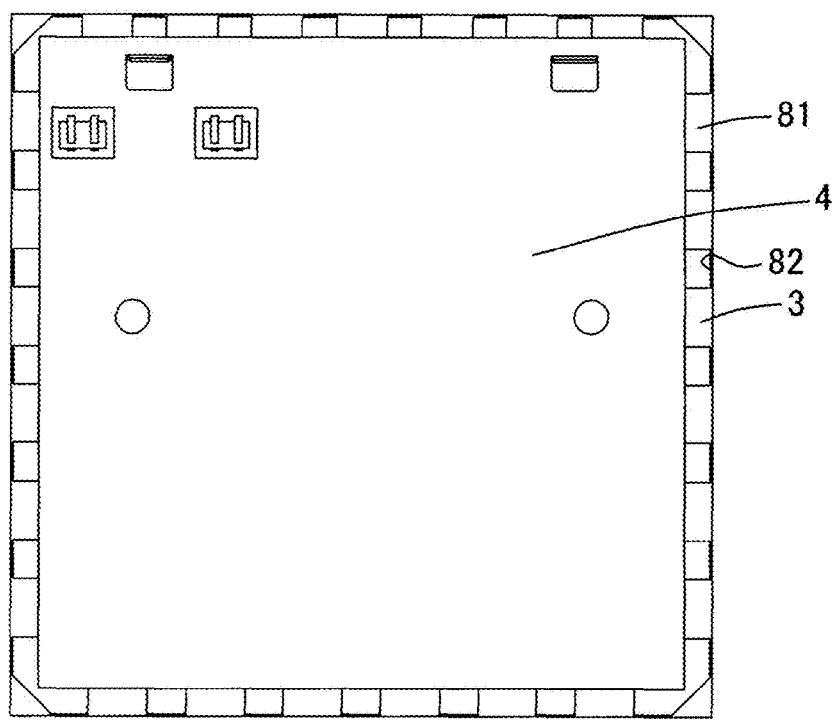

As shown in FIG. 22A, for example, the jacket 3 and the exterior layer 4 are formed apart each other to create a gap between the jacket and the exterior layer. The jacket 3 and the exterior layer 4 may only partially come into contact each other. As shown in FIG. 22B, for example, only top end faces of the jacket side protrusions 81 in protruding directions may come into contact with the exterior layer 4.

In the jacket 3 according to the above described embodiment, the jacket side protrusions 81a, 81b, and 81d formed on three sides differ in number from the jacket side protrusions 81c formed on a remaining side. However, the present invention is not limited to this embodiment. As shown in FIG. 20, for example, the jacket side protrusions 81 on each side may be identical in number.

In the above described embodiment, the planar light-emitting tile 2 is partially provided with the exterior layer 4. However, the present invention is not limited to this embodiment. The exterior layer 4 may not be provided.

In the above described embodiment, the two power supply terminals 62 and 63 supply electric power to the light-emitting function layer 26. However, the present invention is not limited to this embodiment. Only one power supply terminal may supply electric power to the light-emitting function layer 26.

In the above described embodiment, the double sided tapes 95 are attached on portions, which overlap with the light-emitting side cover 50, of the emission surface 10 of the planar light-emitting tile 2, and the casing A around the light-emitting side opening portion 53 is fixed with the double sided tapes 95. However, the present invention is not limited to this embodiment. For example, the double sided tapes 95 may not be used for application.

The double sided tapes 95 are used to attach the planar light-emitting tile 2 and the light-emitting side cover 50. However, the present invention is not limited to this embodiment. A glue agent or an adhesive may be used for attaching.

In the above described embodiment, the sealing layer 28 is configured by the inorganic sealing layer 33 and the protective film 34. However, the present invention is not limited to this embodiment. The sealing layer 28 may be formed with the inorganic sealing layer 33 only.

In the above described embodiment, the planar light-emitting tile 2 is rectangular. However, the present invention is not limited to this embodiment. The planar light-emitting tile 2 may be circular or polygonal. For example, the planar light-emitting tile 2 may be triangular or hexagonal.

In the above described embodiment, the adjacent jacket side protrusions 81 and 81 and the adjacent exterior layer side protrusions 71 and 71 are respectively arranged at regular intervals in a circumferential direction. However, the present invention is not limited to this embodiment. For example, the jacket side protrusions 81 and 81 and the exterior layer side protrusions 71 and 71 may respectively be arranged at different intervals in the circumferential direction.

Similarly, in the above described embodiment, the adjacent jacket side recesses 82 and 82 and the adjacent exterior layer side recesses 72 and 72 are respectively arranged at regular intervals in a circumferential direction. However, the present invention is not limited to this embodiment. For example, the jacket side recesses 82 and 82 and the exterior layer side recesses 72 and 72 may respectively be arranged at different intervals in the circumferential direction.

EXAMPLES

The present invention will now specifically be described herein with reference to an assembled example of the planar light-emitting panel 1 according to the present invention. However, the present invention is not limited to the example and a comparison example.

Example 1

First, a glass substrate 20 with an indium tin oxide (ITO) deposited as a translucent first electrode layer 25 and having a thickness of 0.7 mm is prepared. Then, an electron injection layer, an electron transport layer, a light-emitting layer, a hole transport layer, and a hole injection layer are laminated in this order on the ITO to form light-emitting function layer 26. A second electrode layer 27 made of aluminum is laminated on the light-emitting function layer 26 to form an organic EL light-emitting element 22.

After that, as a nitrogen-containing silicon alloy layer 35 a silicon nitride film is deposited through a CVD method, and as an oxygen-containing silicon alloy layer 36 polysilazane is sprayed through a spray method and burned to form an inorganic sealing layer 33. Finally, a protective film 34 made of polyethylene terephthalate (PET) having an adhesive material thereon is attached to produce an organic EL tile 6.

An external dimension of the organic EL tile 6 is 90 mm×90 mm, while an external dimension of the planar light-emitting region 37 of the organic EL tile 6 is 80 mm×80 mm.

Next, a double sided tape having a size of 82 mm×82 mm and a thickness of 50 μm is applied on the protective film 34 of the organic EL tile 6, and then an anisotropic conductive film (ACF) is attached on a power supplying portion of the glass substrate 20. After that, a release paper of the double sided tape is peeled off and a flexible printed circuit board (FPC) having a thickness of 180 μm is fixed onto the organic EL tile 6, and then an ACF coupling portion is bonded by thermo-compression, and FPC power supply wiring is formed to produce the organic EL tile 6 wired by a power supply member. After the FPC power supply wiring is formed, an optical film is also applied onto a light-emitting side surface of the glass substrate 20, as a resin layer 29.

An exterior layer 4 and an elastic jacket 3 are parallelly prepared.

As for the exterior layer 4, an anti-corrosive treated steel plate having an external dimension of 90.2 mm×90.2 mm and a thickness of 0.4 mm is used. On the exterior layer 4, corner portions are cut away into triangular in a length of 4.9 mm, and six recesses each having a width of 3.3 mm and a length of 7.6 mm are arranged on three sides at intervals of approximately 5 mm. On a remaining side, three recesses having a width of 3.3 mm and a length of 6.6 mm and four recesses having a width of 2.7 mm and a length of 6.6 mm, seven recesses in total, are arranged at an interval of approximately 4.4 mm.

The elastic jacket 3 is made of silicone rubber, and smaller approximately 3% in size than the exterior layer 4. A width of a casing A forming a light-emitting side opening portion 53 is 4.5 mm. A casing B for a rear face side opening portion 55 is designed and produced to fit into the exterior layer 4.

A thickness of rubber of the casing A is 0.3 mm. A thickness of rubber of the casing B is 0.4 mm. A thickness of rubber of each of side faces perpendicular to main faces is 0.4 mm.

These members are assembled to produce the organic EL tile 6. On a preliminarily produced and wired FPC at a back (rear face) of the organic EL tile 6, as well as on the organic EL tile 6, a double sided tape having a dimension of 89.8 mm×89.8 mm and a thickness of 0.1 mm is attached as an adhesive member 5, and then the exterior layer 4 is further applied to form a planar light-emitting tile 2.

Next, on a portion, which is to be lied under the casing A, of one of surfaces of the organic EL tile 6 of the planar light-emitting tile 2, double sided tapes 95 each having a length of 85 mm, a width of 3 mm, and a thickness of 0.1 mm are attached.

Finally, the elastic jacket 3 is placed on the organic EL tile 6 of the planar light-emitting tile 2. At this time, protrusions and recesses around the exterior layer 4 and protrusions and recesses around the rear face side opening portion 55 of the elastic jacket 3 are fitted. With the double sided tape, i.e. the adhesive member 5, attached beforehand for fixing the organic EL tile 6 and the exterior layer 4, and exposed to the recesses on an outer circumference of the exterior layer 4, the elastic jacket 3 and the organic EL tile 6 are fixed. With the double sided tapes 95 attached onto the portion, which is to be lied under the casing A, of the one of the surfaces of the organic EL tile, the casing A and the organic EL tile 6 are fixed. As described above, the planar light-emitting tile 2 and the elastic jacket 3 are attached to finish the organic EL panel as the example 1 of the planar light-emitting panel 1.

With this organic EL panel, the elastic jacket 3 has neither removed, peeled off, nor expanded even though touched and an endurance test has been conducted for 500 hours at a temperature of 85° C. and a relative humidity of 85%.

Therefore, the elastic jacket 3 has been confirmed to well function as an edge protection member.

Comparison Example 1

Figure 3:
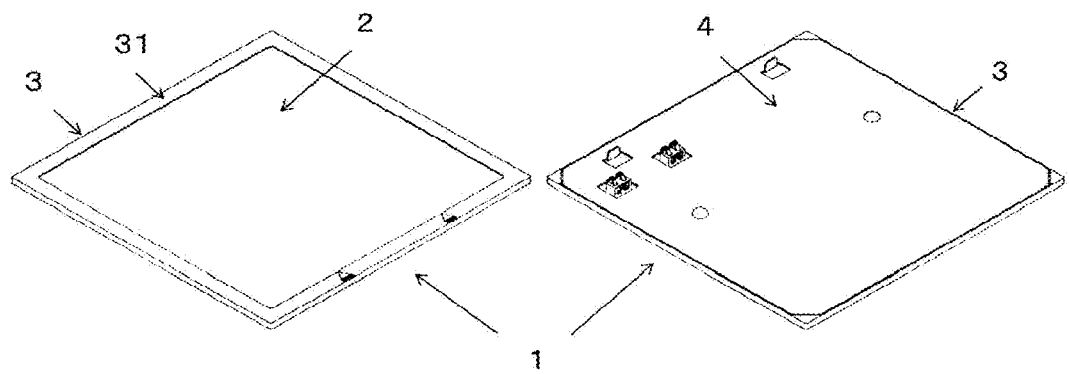
FIG. 3 is an external view of an organic EL panel according to a comparison example.

Similar or identical to the above described example, an organic EL tile 6 is produced. An exterior layer and an elastic jacket are separately prepared. However, as shown in FIG. 3, different to the exterior layer 4 and the elastic jacket 3 in the example 1, an uneven structure is not formed on an outer circumference of the exterior layer and around a rear face side opening portion of the elastic jacket. A double sided tape is attached, similar or identical to the example 1, to assemble the exterior layer and the elastic jacket into an organic EL panel.

With the organic EL panel according to the comparison example 1, the elastic jacket has been removed, peeled off, and expanded when touched. As a result, the elastic jacket has not been fully functioned as an edge protection member.

As described above, forming projections and recesses on a rear face of an elastic jacket 3 can prevent the elastic jacket 3 from being removed or peeled off from a planar light-emitting tile 2, or from being expanded.

EXPLANATION OF REFERENCE SIGNS

1: planar light-emitting panel (organic EL panel)
2: planar light-emitting tile (light-emitting tile)
3: elastic jacket
4: exterior layer
6: organic EL tile
20: glass substrate
21: organic EL light-emitting element layer
29: resin layer
31: casing A
32: casing B
33: inorganic sealing layer
37: planar light-emitting region
38: sub-light-emitting region (light-emitting region)
50: light-emitting side cover (front face side cover)
51: rear face side cover
52: side face side cover
55: rear face side opening portion (rear face side opening)
70: main body
71, 71a, 71b, 71c, 71d: exterior layer side protrusions
72, 72a, 72b, 72c, 72d: exterior layer side recesses
81, 81a, 81b, 81c, 81d: jacket side protrusions
92: adhesive layer

The invention claimed is:
1. A planar light-emitting panel comprising:
a light-emitting tile built on a glass substrate, the light-emitting tile having an emission surface on a front face thereof; and
an elastic jacket covering edge end faces of the glass substrate,
the elastic jacket having a rear face side cover that covers at least a portion of a rear face of the light-emitting tile, and a front face side cover that covers a portion of a front face of the light-emitting tile,
the rear face side cover being formed in a ring shape to form a rear face side opening and having a plurality of jacket side protrusions that protrude toward a center side thereof in a rear face view,
wherein the plurality of jacket side protrusions, arranged adjacent to each other, form part of the rear face side opening and are arranged in parallel at predetermined intervals in a circumferential direction of the rear face side opening, wherein two of the adjacent jacket side protrusions form a jacket side recess that recesses from a center side of the rear face side opening, such that the plurality of jacket side protrusions form a plurality of jacket side recesses, wherein the light-emitting tile comprises an organic light-emitting tile and an exterior layer that covers a portion of the rear face of the organic light-emitting tile, wherein the two of the adjacent jacket side protrusions and the front face side cover of the elastic jacket are configured to sandwich a portion of the light-emitting tile including the organic light-emitting tile but excluding the exterior layer, and wherein the exterior layer is in contact with the jacket side protrusions in the rear face view.

2. The planar light-emitting panel according to claim 1, wherein the light-emitting tile is a polygon having a first side, and wherein the rear face side cover is provided with at least three of the jacket side recesses in parallel along the first side of the light-emitting tile.

3. The planar light-emitting panel according to claim 2, wherein the light-emitting tile has a second side opposite to the first side of the light-emitting tile, and wherein the rear face side cover is also provided with at least three of the jacket side recesses along the second side of the light-emitting tile.

4. The planar light-emitting panel according to claim 1, wherein the light-emitting tile is a polygon, and wherein the rear face side cover is provided with the jacket side recesses on each side of the light-emitting tile.

5. The planar light-emitting panel according to claim 1, wherein the front face side cover is formed in a ring shape so as to surround the emission surface, the front face side cover having an average width wider than an average width of the rear face side cover excluding the jacket side protrusions thereof.

6. The planar light-emitting panel according to claim 5, wherein the elastic jacket includes a side cover covering side end faces of the light-emitting tile, the side cover joining the front face side cover and the rear face side cover continuously or intermittently around a whole circumference of the light-emitting tile.

7. The planar light-emitting panel according to claim 1, wherein the light-emitting tile comprises:
the organic light-emitting tile including an organic EL light-emitting element layer on a main face of the glass substrate.

8. The planar light-emitting panel according to claim 7, wherein the exterior layer comprises:
a main body expanding in plane in the rear face view; and
exterior layer side protrusions protruding outward from an outer circumferential edge of the main body and engaging with the jacket side protrusions.

9. The planar light-emitting panel according to claim 8, wherein the exterior layer side protrusions fit into the jacket side recesses.

10. The planar light-emitting panel according to claim 1, wherein the light-emitting tile comprises:
the organic light-emitting tile including an organic EL light-emitting element layer on a main face of the glass substrate; and
the exterior layer forming an exterior of the light-emitting tile, and
wherein an inorganic sealing layer and an adhesive layer are interposed between the glass substrate and the exterior layer,
the inorganic sealing layer covering part of the organic EL light-emitting element layer,
the adhesive layer expanding in plane and partially or wholly covering the inorganic sealing layer,
the inorganic sealing layer having a minimum average thickness of 1 μm but being thinner than a thickness of the adhesive layer.

11. The planar light-emitting panel according to claim 1, wherein the light-emitting tile is a white light-emitting tile having a white emission surface, and
wherein the elastic jacket includes a white pigment to be substantially white in color.

12. The planar light-emitting panel according to claim 1, wherein the light-emitting tile includes a light scattering resin layer laminated on the emission surface.

13. The planar light-emitting panel according to claim 1, wherein the emission surface emits light when a planar light-emitting region emits light, and
wherein the planar light-emitting region includes a plurality of sub-light-emitting regions separated from each other.

14. An elastic jacket covering edge end faces of a light-emitting tile having an emission surface on a front face thereof, the light-emitting tile comprising an organic light-emitting tile and an exterior layer that covers a portion of a rear face of the organic light-emitting tile,
the elastic jacket comprising a rear face side cover that covers at least a portion of a rear face of the light-emitting tile, and a front face side cover that covers a portion of a front face of the light-emitting tile,
the rear face side cover being formed in a ring shape to form a rear face side opening and having a plurality of jacket side protrusions, arranged adjacent to each other, protruding toward a center side of the rear face side opening in a rear face view,
the jacket side protrusions forming part of the rear face side opening and being arranged in parallel at predetermined intervals in a circumferential direction of the rear face side opening,
wherein two of the adjacent jacket side protrusions form a jacket side recess that recesses from the center side of the rear face side opening, such that the plurality of jacket side protrusions form a plurality of jacket side recesses,
wherein the two of the adjacent jacket side protrusions and the front face side cover of the elastic jacket are configured to sandwich a portion of the light-emitting tile including the organic light-emitting tile but excluding the exterior layer, and wherein the exterior layer is in contact with the jacket side protrusions in the rear face view.

* * * * *